US012581671B2

(12) United States Patent
Li et al.

(10) Patent No.: US 12,581,671 B2
(45) Date of Patent: Mar. 17, 2026

(54) CAPACITOR STRUCTURE WITH TWO STACKED CONDUCTIVE VIAS

(71) Applicant: NANYA TECHNOLOGY CORPORATION, New Taipei City (TW)

(72) Inventors: Pin-Jhu Li, New Taipei City (TW); Shih-Fan Kuan, Taoyuan City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 375 days.

(21) Appl. No.: 18/135,327

(22) Filed: Apr. 17, 2023

(65) Prior Publication Data

US 2024/0347580 A1     Oct. 17, 2024

(51) Int. Cl.
| | |
|---|---|
| *H10D 1/68* | (2025.01) |
| *H01L 23/522* | (2006.01) |
| *H10B 12/00* | (2023.01) |

(52) U.S. Cl.
CPC ......... *H10D 1/682* (2025.01); *H01L 23/5223* (2013.01); *H10D 1/692* (2025.01); *H10B 12/03* (2023.02); *H10B 12/30* (2023.02)

(58) Field of Classification Search
CPC .... H10D 1/682; H10D 1/692; H01L 23/5223; H10B 12/03; H10B 12/30; H10B 12/02
See application file for complete search history.

(56) References Cited

U.S. PATENT DOCUMENTS

| | | | |
|---|---|---|---|
| 2002/0028553 A1* | 3/2002 | Yokoyama ............. | H10D 1/716 257/E27.088 |
| 2012/0267763 A1* | 10/2012 | Chumakov ......... | H01L 23/5223 257/E27.025 |
| 2016/0126324 A1 | 5/2016 | Yu et al. | |
| 2021/0202486 A1 | 7/2021 | Kim et al. | |
| 2022/0223468 A1* | 7/2022 | Lu .......................... | H10D 1/042 |

FOREIGN PATENT DOCUMENTS

| | | |
|---|---|---|
| CN | 113053900 A | 6/2021 |
| CN | 115224009 A | 10/2022 |
| TW | 202131488 A | 8/2021 |
| TW | 202213830 A | 4/2022 |
| WO | WO2022205694 A1 | 10/2022 |

OTHER PUBLICATIONS

Office Action and Search Report dated on Mar. 7, 2024 related to Taiwanese Application No. 112129029.
Office Action and and the search report mailed on Apr. 29, 2025 related to U.S. Appl. No. 18/135,319.
English translation of foreign patent documents of Office Action Apr. 29, 2025 related to U.S. Appl. No. 18/135,319.

* cited by examiner

*Primary Examiner* — Julia Slutsker
(74) *Attorney, Agent, or Firm* — Xuan Zhang

(57) ABSTRACT

A capacitor structure and a method of manufacturing a capacitor structure are provided. The capacitor structure includes a conductive via, an intermediate dielectric layer and a top electrode. The conductive via includes a neck portion located near a middle portion thereof. The intermediate dielectric layer is disposed on the conductive via. The top electrode is disposed on the intermediate dielectric layer.

12 Claims, 20 Drawing Sheets

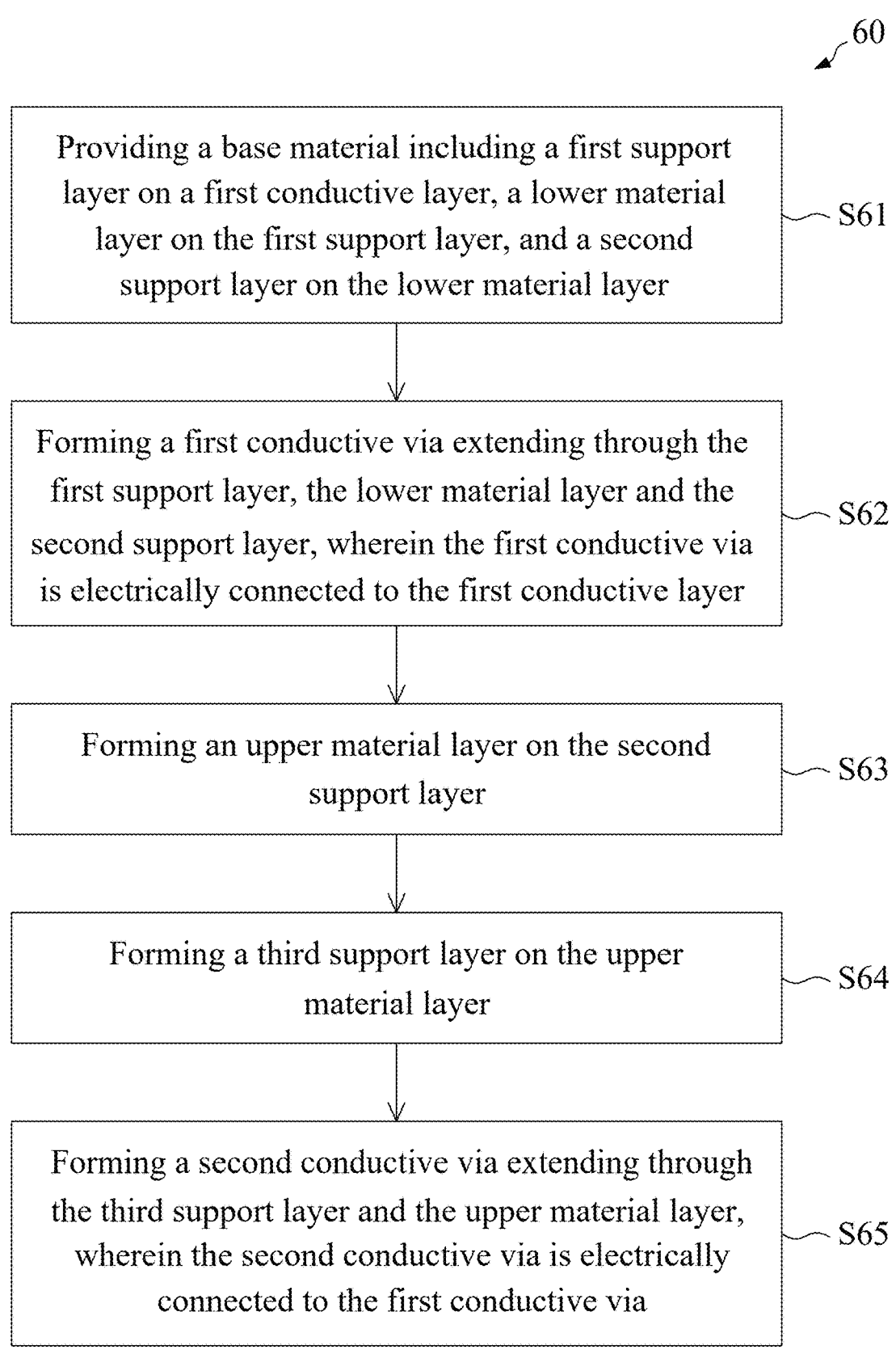

60

Providing a base material including a first support layer on a first conductive layer, a lower material layer on the first support layer, and a second support layer on the lower material layer —— S61

Forming a first conductive via extending through the first support layer, the lower material layer and the second support layer, wherein the first conductive via is electrically connected to the first conductive layer —— S62

Forming an upper material layer on the second support layer —— S63

Forming a third support layer on the upper material layer —— S64

Forming a second conductive via extending through the third support layer and the upper material layer, wherein the second conductive via is electrically connected to the first conductive via —— S65

FIG. 16

CAPACITOR STRUCTURE WITH TWO STACKED CONDUCTIVE VIAS

TECHNICAL FIELD

The present disclosure relates to a capacitor, and more particularly, to a capacitor structure having a conductive structure including at least two stacked conductive vias.

DISCUSSION OF THE BACKGROUND

To accomplish high integration density of an electronic element (e.g., a capacitor), dimensions of conductive vias of the electronic element are reduced, and an aspect ratio (height/width) of the conductive vias is increased. During an etching process for forming a hole to accommodate the conductive via, if an aspect ratio (depth/width) and a position of the hole is fixed, the critical dimension (CD) such as a width of a top end of the hole, is an important issue. The larger the CD is, the less risk of under etch. However, larger CD may increase the risk of short between top ends of adjacent conductive vias after the formation of the conductive vias.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a conductive structure. The conductive structure includes a first support layer, a second support layer, a first conductive via, a third support layer and a second conductive via. The second support layer is disposed over the first support layer. The first conductive via is disposed between the first support layer and the second support layer. The third support layer is disposed over the second support layer. The second conductive via is disposed between the second support layer and the third support layer, and electrically connected to the first conductive via. A lateral surface of the first conductive via is discontinuous with a lateral surface of the second conductive via.

Another aspect of the present disclosure provides a capacitor structure. The capacitor structure includes a conductive via, an intermediate dielectric layer and a top electrode. The conductive via includes a neck portion located near a middle portion thereof. The intermediate dielectric layer is disposed on the conductive via. The top electrode is disposed on the intermediate dielectric layer.

Another aspect of the present disclosure provides a method of manufacturing a conductive structure. The method includes providing a base material including a first support layer on a first conductive layer, a lower material layer on the first support layer, and a second support layer on the lower material layer. The method also includes forming a first conductive via extending through the first support layer, the lower material layer and the second support layer, wherein the first conductive via is electrically connected to the first conductive layer. The method also includes forming an upper material layer on the second support layer. The method also includes forming a third support layer on the upper material layer. The method also includes forming a second conductive via extending through the third support layer and the upper material layer, wherein the second conductive via is electrically connected to the first conductive via.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

FIG. 16 illustrates a flow chart of a method of manufacturing a capacitor structure in accordance with some embodiments of the present disclosure.

DETAILED DESCRIPTION

Figure 1:
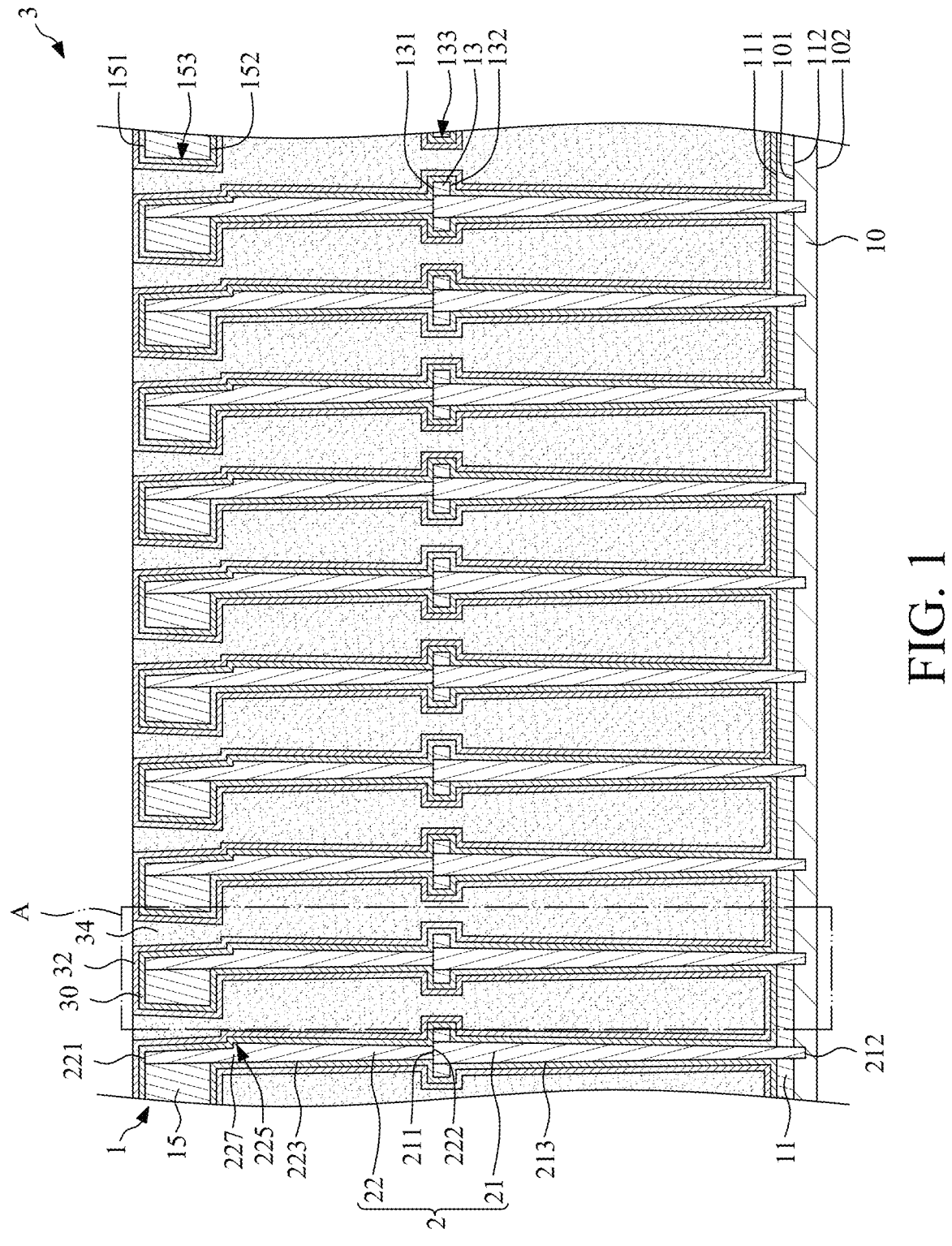
FIG. 1 is a schematic cross-sectional view of a capacitor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
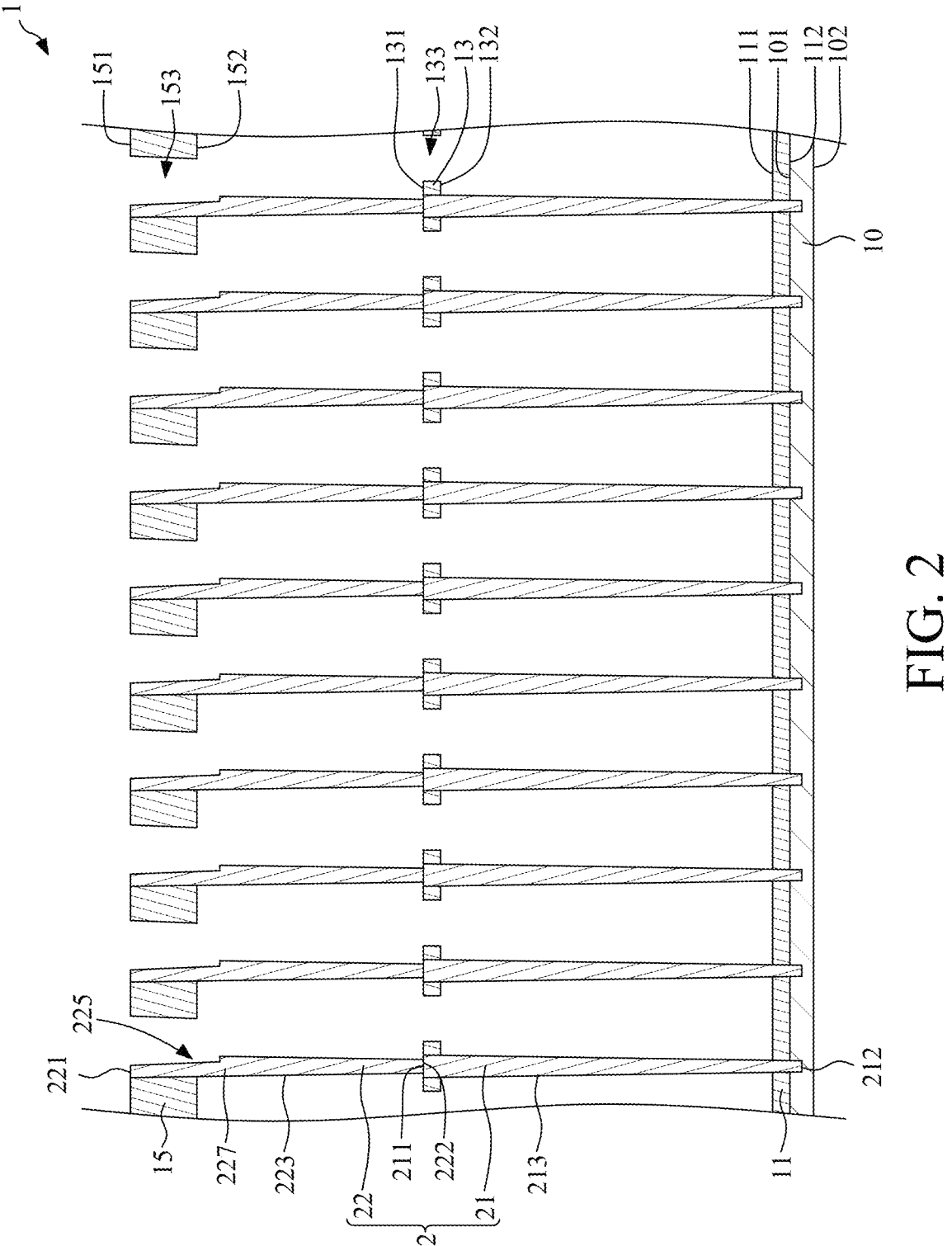
FIG. 2 is a schematic cross-sectional view of a conductive structure of the capacitor structure of FIG. 1, wherein the intermediate dielectric layer and the top electrode are omitted for clarity of illustration.
Figure 3A:
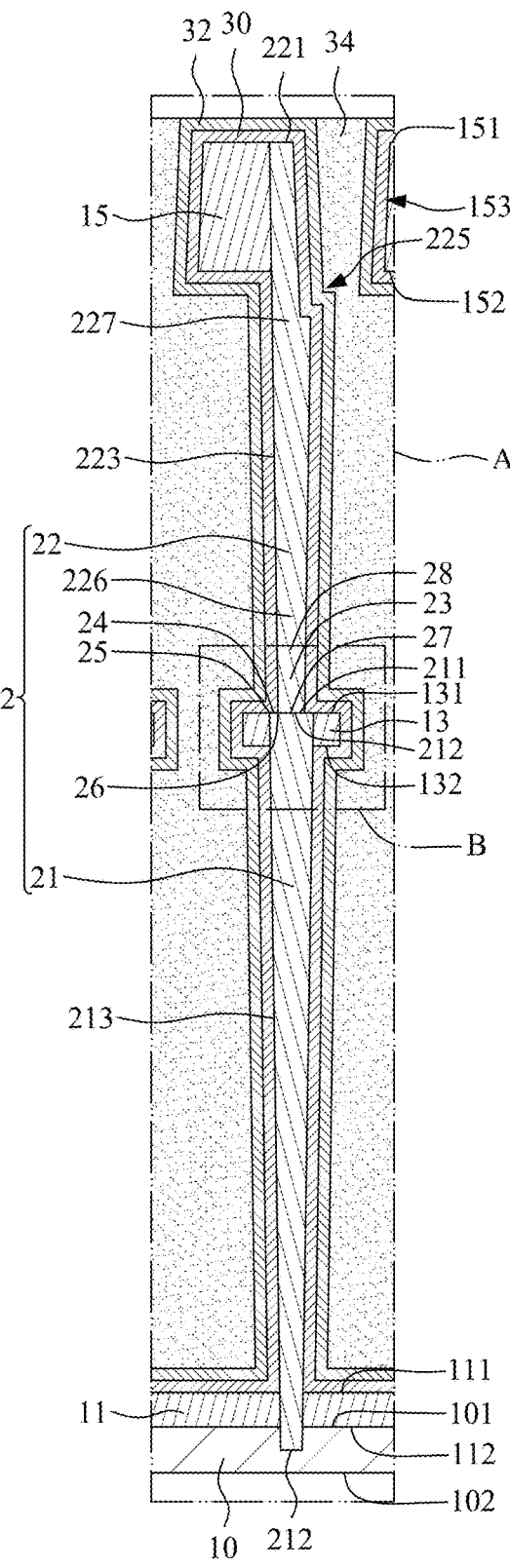
FIG. 3A illustrates an enlarged view of an area "A" of FIG. 1.
Figure 3B:
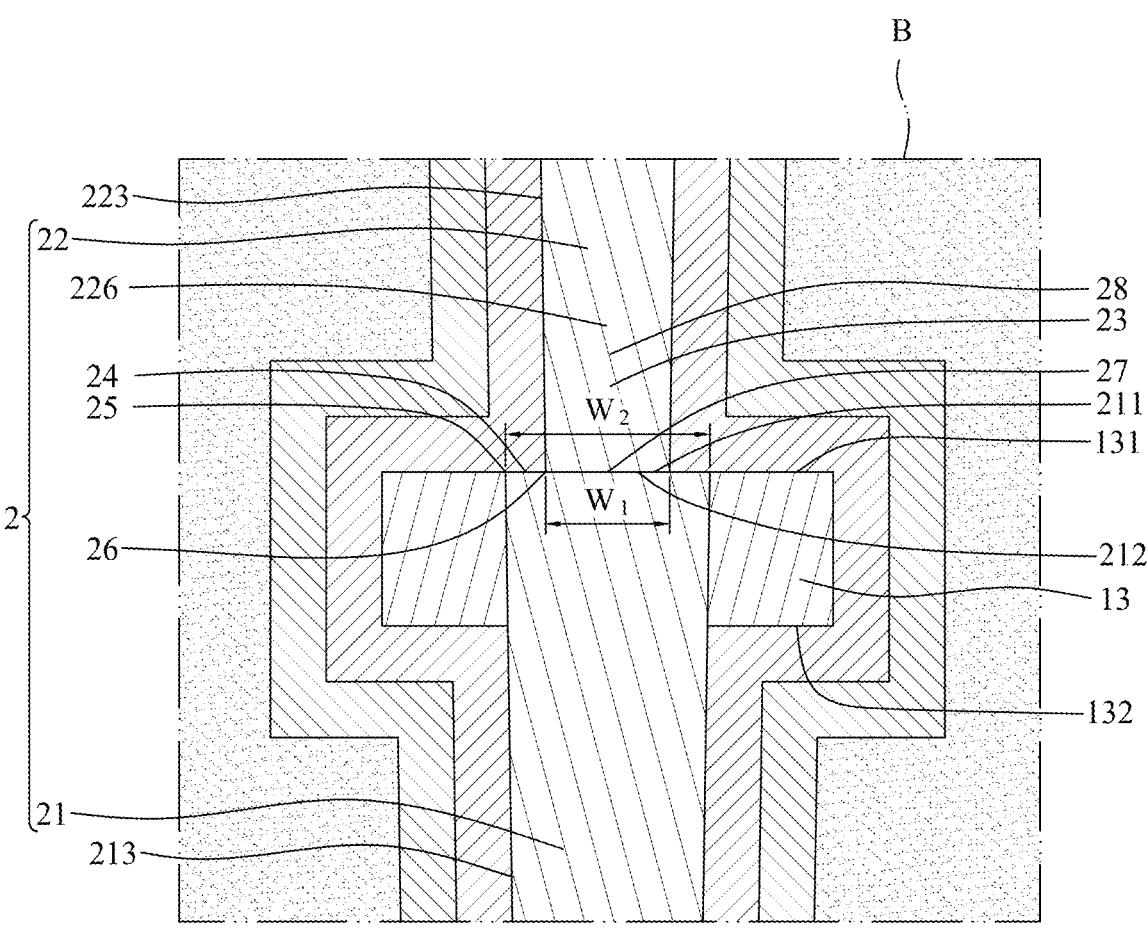
FIG. 3B illustrates an enlarged view of an area "B" of FIG. 3A.

FIG. 1 is a schematic cross-sectional view of a capacitor structure 3 in accordance with some embodiments of the present disclosure. FIG. 2 is a schematic cross-sectional view of a conductive structure 1 of the capacitor structure 3 of FIG. 1, wherein the intermediate dielectric layer 30 and the top electrode 32 are omitted for clarity of illustration. FIG. 3A illustrates an enlarged view of an area "A" of FIG. 1. FIG. 3B illustrates an enlarged view of an area "B" of FIG. 3B.

In some embodiments, the conductive structure 1 (FIG. 2) may be a bottom electrode of the capacitor structure 3 (FIG. 1) of a memory cell. In some embodiments, the memory cell may include a dynamic random access memory cell (DRAM cell). In some embodiments, the conductive structure 1 may be a part of an interconnection structure over a substrate of a semiconductor device. It is contemplated that more intermetal dielectric layers and the associated conductive layers and conductive vias may be formed over the conductive structure 1 and/or the capacitor structure 3.

In addition, the conductive structure 1 and/or the capacitor structure 3 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

As shown in FIG. 1, in some embodiments, the capacitor structure 3 may include the conductive structure 1 (e.g., a bottom electrode), an intermediate dielectric layer 30, a top electrode 32 and a filling material 34. In some embodiments, the intermediate dielectric layer 30 may be a high-k dielectric layer, and may be disposed on the conductive via 2 of the conductive structure 1. The top electrode 32 may be a conductive layer, and may be disposed on the intermediate dielectric layer 30. Thus, the intermediate dielectric layer 30 may be disposed between the conductive via 2 of the conductive structure 1 and top electrode 32. In some embodiments, the intermediate dielectric layer 30 may be conformal with the conductive via 2 of the conductive structure 1, and the top electrode 32 may be conformal with the intermediate dielectric layer 30. In addition, the filling material 34 may fill the recess or cavity defined by the top electrode 32. The filling material 34 may be a dielectric material or an insulation material.

As shown in FIG. 2 and FIG. 3A, in some embodiments, the conductive structure 1 may include a first conductive layer 10, a first support layer 11, a second support layer 13, a third support layer 15, and at least one conductive via 2.

In some embodiments, the first conductive layer 10 may include a suitable conductive material. For example, the first conductive layer 10 may include tungsten (W), copper (Cu), aluminum (Al), silver (Ag), an alloy thereof, or a combination thereof. The first conductive layer 10 may have a top surface 101 and a bottom surface 102 opposite to the top surface 101.

The first support layer 11 may be disposed on the first conductive layer 10. The first support layer 11 may have a top surface 111 and a bottom surface 112 opposite to the top surface 111. The bottom surface 112 of the first support layer 11 may face and contact the top surface 101 of the first conductive layer 10. For example, the bottom surface 112 of the first support layer 11 may directly contact the top surface 101 of the first conductive layer 10.

For example, the first support layer 11 may be a dielectric layer or an insulation layer, and may include silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof.

The second support layer 13 may be disposed over the first support layer 11. The second support layer 13 may be spaced apart from the first support layer 11. The second support layer 13 may have a top surface 131 and a bottom surface 132 opposite to the top surface 131. The bottom surface 132 of the second support layer 13 may face the top surface 111 of the first support layer 11.

For example, the second support layer 13 may be a dielectric layer or an insulation layer, and may include silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. The material of the second support layer 13 may be same as or different from the material of the first support layer 11. The thickness of the second support layer 13 may be equal to or different from the thickness of the first support layer 11.

The third support layer 15 may be disposed over the second support layer 13. The third support layer 15 may be spaced apart from the second support layer 13. The third support layer 15 may have a top surface 151 and a bottom surface 152 opposite to the top surface 151. The bottom surface 152 of the third support layer 15 may face the top surface 131 of the second support layer 13.

For example, the third support layer 15 may be a dielectric layer or an insulation layer, and may include silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. The material of the third support layer 15 may be same as or different from the material of the second support layer 13. The thickness of the third support layer 15 may be equal to or different from the thickness of the second support layer 13. For example, the first support layer 11, the second support layer 13 and the third support layer 15 may be chosen based on one or more selective etching operations.

The at least one conductive via 2 may include a plurality of conductive vias 2 arranged in an array and extending through the first support layer 11, the second support layer 13 and the third support layer 15. Each of the conductive vias 2 may include a first conductive via 21 and a second conductive via 22 stacked on the first conductive via 21. As shown in FIG. 2 and FIG. 3A, both the first conductive via 21 and the second conductive via 22 may taper toward the first support layer 11 and the first conductive layer 10. That is, the first conductive via 21 and the second conductive via 22 may taper toward a same direction. Thus, the conductive via 2 may include a neck portion 23 and a shoulder portion 24 located near a middle portion 28 of the conductive via 2. A width of the neck portion 23 is less than a width of the shoulder portion 24. The neck portion 23 connects to the shoulder portion 24 so to form a step structure.

The first conductive via 21 is disposed between the first support layer 11 and the second support layer 13. For example, the first conductive via 21 may include tungsten (W), copper (Cu), aluminum (Al), silver (Ag), titanium (Ti), an alloy thereof, or a combination thereof. In some embodiments, the first conductive via 21 may include titanium silicon nitride (TiSiN), titanium nitride (TiN), titanium aluminum nitride (TiAlN), titanium boron nitride (TiBN), titanium silicide (TiSi), titanium tungsten (TiW), titanium oxynitride (TiON), and titanium aluminum oxynitride (TiAlON).

The first conductive via 21 may have a top surface 211, a bottom surface 212 opposite to the top surface 211, and a lateral surface 213 extending between the top surface 211 and the bottom surface 212. A width of the top surface 211 is greater than a width of the bottom surface 212. A width of the first conductive via 21 may increase gradually from the bottom surface 212 to the top surface 211. Thus, one side of the lateral surface 213 of the first conductive via 21 is a single substantially straight line from a cross-sectional view.

As shown in FIG. 2 and FIG. 3A, a lower portion of the first conductive via 21 may extend through the first support layer 11 and may extend into the first conductive layer 10. Thus, the lower portion of the first conductive via 21 may be embedded in the first conductive layer 10 so that the first conductive via 21 may be electrically connected to the first conductive layer 10. The lower portion of the first conductive via 21 may not extend through the first conductive layer 10. An elevation of the bottom surface 212 of the first conductive via 21 may be between an elevation of the top surface 101 of the first conductive layer 10 and the bottom surface 102 of the first conductive layer 10.

In addition, the upper portion of the first conductive via 21 may extend through the second support layer 13. The top surface 211 of the first conductive via 21 may be exposed from the second support layer 13. The top surface 211 of the first conductive via 21 may be substantially aligned with or substantially coplanar with the top surface 131 of the second support layer 13.

The second conductive via 22 is disposed between the second support layer 13 and the third support layer 15. For example, the second conductive via 22 may include tungsten (W), copper (Cu), aluminum (Al), silver (Ag), titanium (Ti), an alloy thereof, or a combination thereof. In some embodiments, the second conductive via 22 may include titanium silicon nitride (TiSiN), titanium nitride (TiN), titanium aluminum nitride (TiAlN), titanium boron nitride (TiBN), titanium silicide (TiSi), titanium tungsten (TiW), titanium oxynitride (TiON), and titanium aluminum oxynitride (TiAlON). The material of the second conductive via 22 may be same as or different from the material of the first conductive via 21.

The second conductive via 22 may have a top surface 221, a bottom surface 222 opposite to the top surface 221, and a lateral surface 223 extending between the top surface 221 and the bottom surface 222. A width of the top surface 221 may be greater than a width of the bottom surface 222. A width of the second conductive via 22 may increase gradually from the bottom surface 222 to the top surface 221. Thus, one side of the lateral surface 223 of the second conductive via 22 is a single substantially straight line from a cross-sectional view.

As shown in FIG. 3A, the bottom surface 222 of the second conductive via 22 may contact the top surface 211 of the first conductive via 21 so as to form an interface 27 between the second conductive via 22 and the first conductive via 21. Thus, the second conductive via 22 may stand on the first conductive via 21, and may be electrically connected to the first conductive via 21. As shown in FIG. 3B, a size (e.g., a width W1) of the interface 27 may be substantially equal to a size (e.g., a width W1) of the bottom surface 222 of the second conductive via 22. The size (e.g., a width W1) of the interface 27 may be less than a size (e.g., a width W2) of the top surface 211 of the first conductive via 21. Alternatively, a width of the bottom surface 222 of the second conductive via 22 may be less than a width of the top surface 211 of the first conductive via 21. It is contemplated that the top surface 211 of the first conductive via 21 may include the interface 27 and the shoulder portion 24 disposed around or surrounding the interface 27. The interface 27 may be substantially coplanar with the top surface 131 of the second support layer 13.

In addition, the upper portion 227 of the second conductive via 22 may extend through the third support layer 15. The top surface 221 of the second conductive via 22 may be exposed from the third support layer 15. The top surface 221 of the second conductive via 22 may be substantially aligned with or substantially coplanar with the top surface 151 of the third support layer 15. The lower portion 226 of the second conductive via 22 may include the neck portion 23.

As shown in FIG. 3A, the lateral surface 213 of the first conductive via 21 is discontinuous with the lateral surface 223 of the second conductive via 22. Alternatively, the lateral surface 213 of the first conductive via 21 is non-coplanar with the lateral surface 223 of the second conductive via 22. Thus, in a cross-sectional view, one side of the lateral surface 213 of the first conductive via 21 is misaligned with one side of the lateral surface 223 of the second conductive via 22. That is, the side of the lateral surface 213 of the first conductive via 21 and the side of the lateral surface 223 of the second conductive via 22 are not segments of a same substantially straight line. On side of the entire lateral surface of the entire conductive via 2 is not a substantially straight line from a cross-sectional view. In some embodiments, the side of the lateral surface 213 of the first conductive via 21 is connected to the side of the lateral surface 223 of the second conductive via 22 through the shoulder portion 24 of the top surface 211 of the first conductive via 21. On side of the entire lateral surface of the entire conductive via 2 may have at least two turning points 25, 26. The distance or area between the turning points 25, 26 is the shoulder portion 24.

In some embodiments, the lateral surface 213 of the entire first conductive via 21 has a substantially consistent slope, and a lateral surface 223 of the entire second conductive via 22 has a substantially consistent slope. The slope of the lateral surface 213 of the first conductive via 21 may be equal to or different from the slope of the lateral surface 223 of the second conductive via 22. A length or height of the first conductive via 21 may be equal to or different from a length or height of the second conductive via 22. In some embodiments, the aspect ratio (height/width) of the first conductive via 21 may be equal to or different from the aspect ratio (height/width) of the second conductive via 22. For example, the aspect ratio (height/width) of the first conductive via 21 may be about 22.3, and the aspect ratio (height/width) of the second conductive via 22 may be about 15.3.

As shown in FIG. 1 and FIG. 2, the second support layer 13 may define a plurality of openings 133 extending through the second support layer 13. The third support layer 15 may define a plurality of openings 153 extending through the third support layer 15. The second conductive via 22 may define an indentation portion 225 at an upper portion 227 of the second conductive via 22. A sidewall of the indentation portion 225 of the second conductive via 22 may be substantially aligned with or substantially coplanar with a sidewall of the opening 153 of the third support layer 15 since they are formed concurrently at a same manufacturing stage. As shown in FIG. 11B, three sidewalls of three indentation portions 225 of three second conductive vias 22 and a sidewall of the opening 153 of the third support layer 15 may jointly define a complete circle 9 from a top view.

As shown in FIG. 1, the intermediate dielectric layer 30 may cover and contact the sidewalls of the openings 133 of the second support layer 13, the sidewalls of the openings 153 of the third support layer 15, and portions of the conductive via 2 exposed from the first support layer 11, the second support layer 13 and the third support layer 15. Thus, the intermediate dielectric layer 30 may cover and contact the lateral surface of the conductive via 2 except for portions embedded in the first support layer 11, the second support layer 13 and the third support layer 15. Thus, the intermediate dielectric layer 30 may further cover and contact the indentation portion 225 of the second conductive via 22.

In the embodiment illustrated in FIG. 1 to FIG. 3B, the assembly of the first conductive via 21 and the second conductive via 22 may replace a single monolithic via extending from the third support layer 15 to the first support layer 11. Thus, the under etch problem may be improved, and the risk of short between top ends of adjacent vias after the formation of the vias is lowered. In addition, the aspect ratio of each of the first conductive via 21 and the second conductive via 22 is less than the aspect ratio of the single monolithic via, thus the plating yield or plating quality is improved. Therefore, the product yield of the capacitor structure 3 is raised. Further, the aspect ratio of each of the first conductive via 21 and the second conductive via 22 may be adjusted so as to facilitate the manufacturing process since the sizes of the first conductive via 21 and the second conductive via 22 may be unrestricted by the tool limitation.

Figure 4:
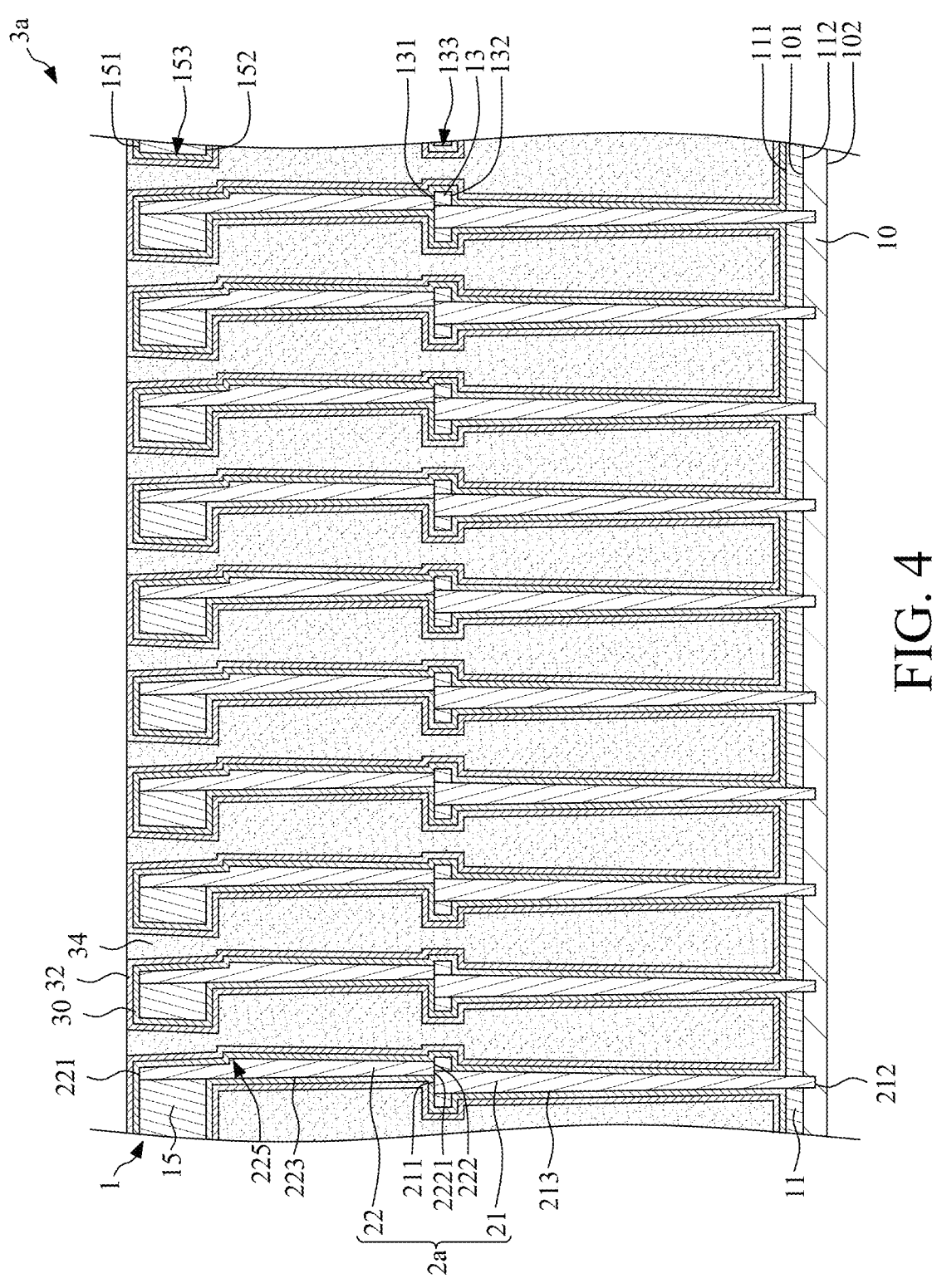
FIG. 4 is a schematic cross-sectional view of a capacitor structure in accordance with some embodiments of the present disclosure.

FIG. 4 illustrates a cross-sectional view of a capacitor structure 3a according to some embodiments of the present disclosure. The capacitor structure 3a is similar to the capacitor structure 3 shown in FIG. 1, except for a structure of the conductive via 2a. The same or similar components or units are annotated with similar symbols. As shown in the capacitor structure 3a of FIG. 4, the central axis of the second conductive via 22 may be misaligned with the central axis of the first conductive via 21. There may be a shift between a vertical projection of the second conductive via 22 and a vertical projection of the first conductive via 21. Thus, a first portion of the bottom surface 222 of the second conductive via 22 may be disposed outside the top surface 211 of the first conductive via 21, and may contact the top surface 131 of the second support layer 13. A second portion 2221 of the bottom surface 222 of the second conductive via 22 may still contact the top surface 211 of the first conductive via 21.

FIG. 5 through FIG. 15 illustrate stages of a method for manufacturing a capacitor structure according to some embodiments of the present disclosure. At least some of these figures have been simplified for a better understanding of the aspects of the present disclosure. In some embodiments, the method is for manufacturing the capacitor structure 3 shown in FIG. 1 and the conductive structure 1 shown in FIG. 2.

Figure 5:
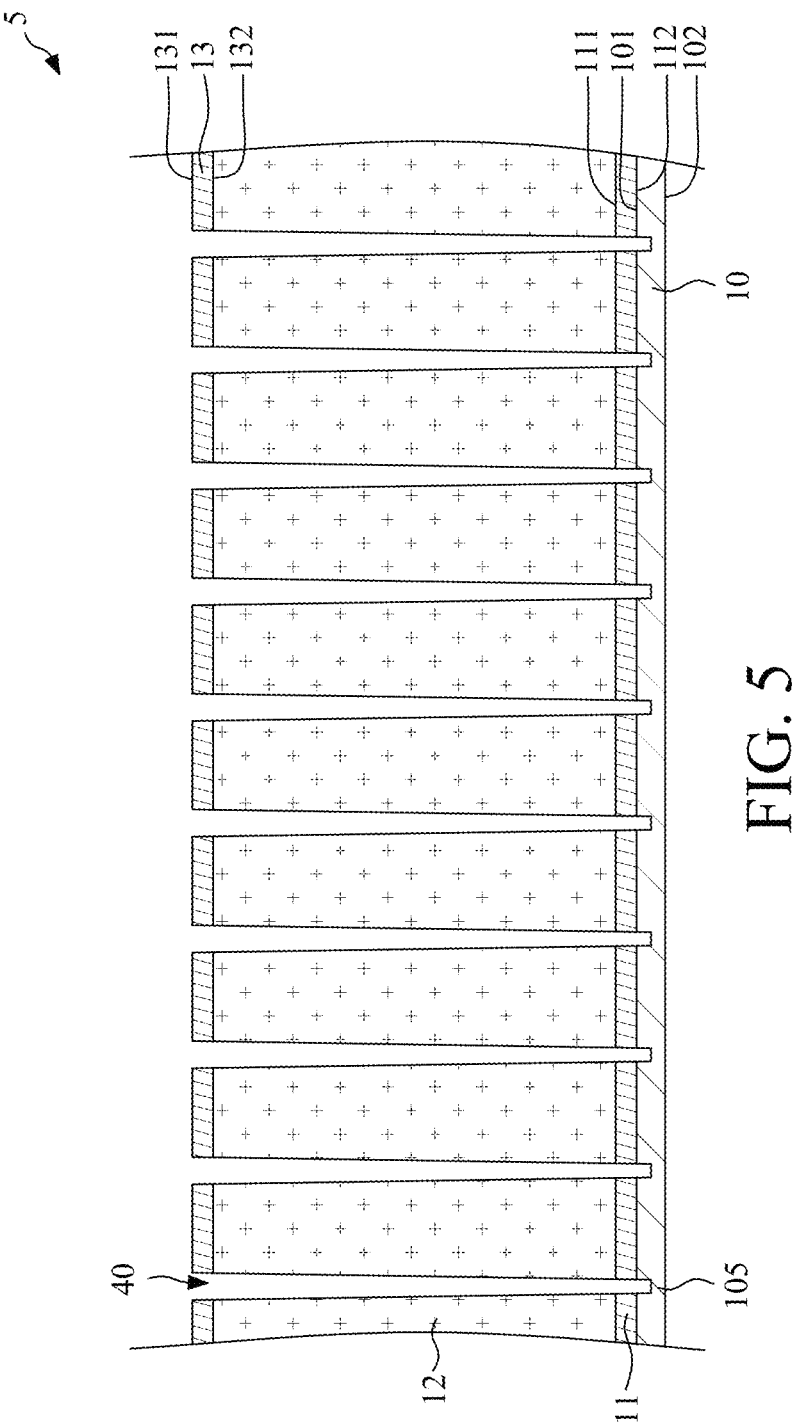
FIG. 5 illustrates one or more stages of a method of manufacturing a capacitor structure in accordance with some embodiments of the present disclosure.

Referring to FIG. 5, a base material 5 is provided. The base material 5 may include a first conductive layer 10, a first support layer 11, a lower material layer 12 and a second support layer 13. The first support layer 11 is formed or disposed on the first conductive layer 10.

The first conductive layer 10 of FIG. 5 may be similar to or same as the first conductive layer 10 of FIG. 1, and may have a top surface 101 and a bottom surface 102 opposite to the top surface 101. The first support layer 11 of FIG. 5 may be similar to or same as the first support layer 11 of FIG. 1, and may have a top surface 111 and a bottom surface 112 opposite to the top surface 111. The bottom surface 112 of the first support layer 11 may face and contact the top surface 101 of the first conductive layer 10. The first support layer 11 may be formed by deposition.

The lower material layer 12 is formed or disposed on the top surface 111 of the first support layer 11. The lower material layer 12 may include a dielectric material or an insulation material, such as nitride, oxide, oxynitride amorphous silicon, polycrystalline silicon, or other suitable another. For example, the lower material layer 12 may include boron phosphorus silicate glass (BPSG) that is an oxide doped with boron and phosphorus. The lower material layer 12 may be formed by deposition.

The second support layer 13 may be formed or disposed on the lower material layer 12. The second support layer 13 of FIG. 5 may be similar to or same as the second support layer 13 of FIG. 1, and may have a top surface 131 and a bottom surface 132 opposite to the top surface 131. The second support layer 13 may be formed by deposition.

Then, a plurality of first blind holes 40 may be formed to extend through the first support layer 11, the lower material layer 12 and the second support layer 13. The first blind holes 40 may extend into the first conductive layer 10 but may not extend through the first conductive layer 10. That is, the first blind holes 40 may be stopped by the first conductive layer 10. In some embodiments, the first blind holes 40 may be formed by photography and etching process from the top surface 131 of the second support layer 13. Thus, the first support layer 11, the lower material layer 12 and the second support layer 13 are patterned to form the first blind holes 40 to expose a part 105 of the first conductive layer 10. The first blind holes 40 may taper toward the first conductive layer 10.

Figure 6:
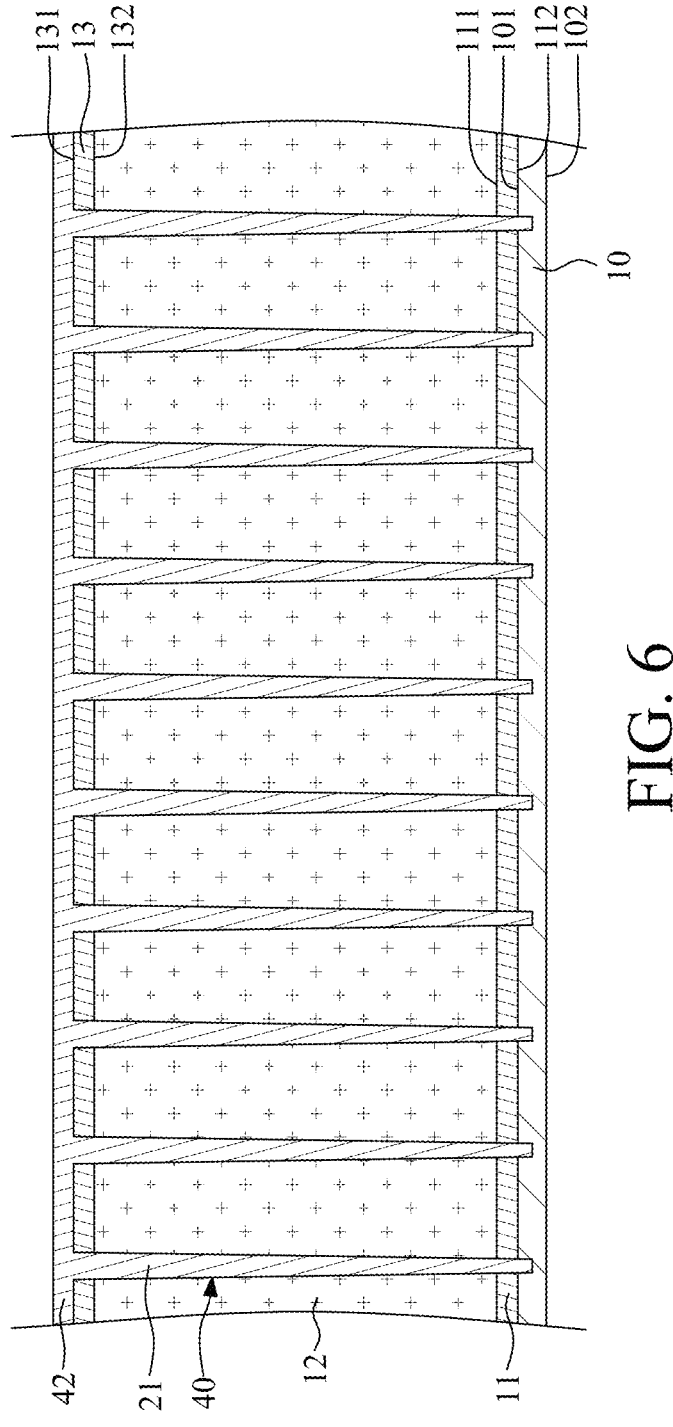
FIG. 6 illustrates one or more stages of a method of manufacturing a capacitor structure in accordance with some embodiments of the present disclosure.

Referring to FIG. 6, a conductive material 42 is formed or disposed on the top surface 131 of the second support layer 13. A portion of the conductive material 42 may be disposed in the first blind holes 40 to fill up the first blind holes 40 to form a plurality of first conductive vias 21. The conductive material 42 may be formed by deposition.

Figure 7:
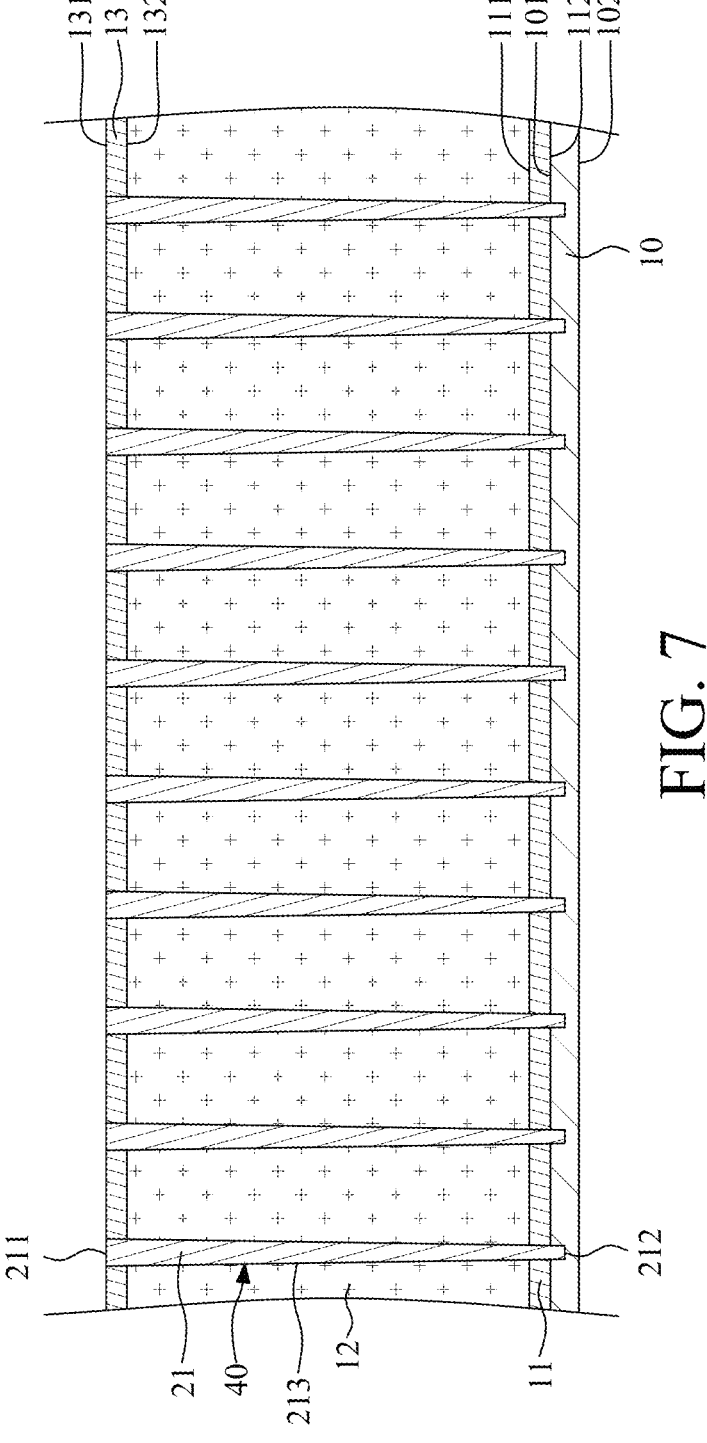
FIG. 7 illustrates one or more stages of a method of manufacturing a capacitor structure in accordance with some embodiments of the present disclosure.

Referring to FIG. 7, the portion of the conductive material 42 that is on the top surface 131 of the second support layer 13 is removed by, for example, grinding. Thus, the first conductive vias 21 are exposed. The first conductive vias 21 of FIG. 7 may be similar to or same as the first conductive via 21 of FIG. 1, and may have a top surface 211, a bottom surface 212 opposite to the top surface 211, and a lateral surface 213 extending between the top surface 211 and the bottom surface 212. A width of the top surface 211 is greater than a width of the bottom surface 212. A width of the first conductive via 21 may increase gradually from the bottom surface 212 to the top surface 211.

A lower portion of the first conductive via 21 may extend through the first support layer 11 and may extend into the first conductive layer 10. Thus, the lower portion of the first conductive via 21 may be embedded in the first conductive layer 10 so that the first conductive via 21 may be electrically connected to the first conductive layer 10. In addition, the upper portion of the first conductive via 21 may extend through the second support layer 13. The top surface 211 of the first conductive via 21 may be exposed from the second support layer 13. The top surface 211 of the first conductive via 21 may be substantially aligned with or substantially coplanar with the top surface 131 of the second support layer 13.

Figure 8:
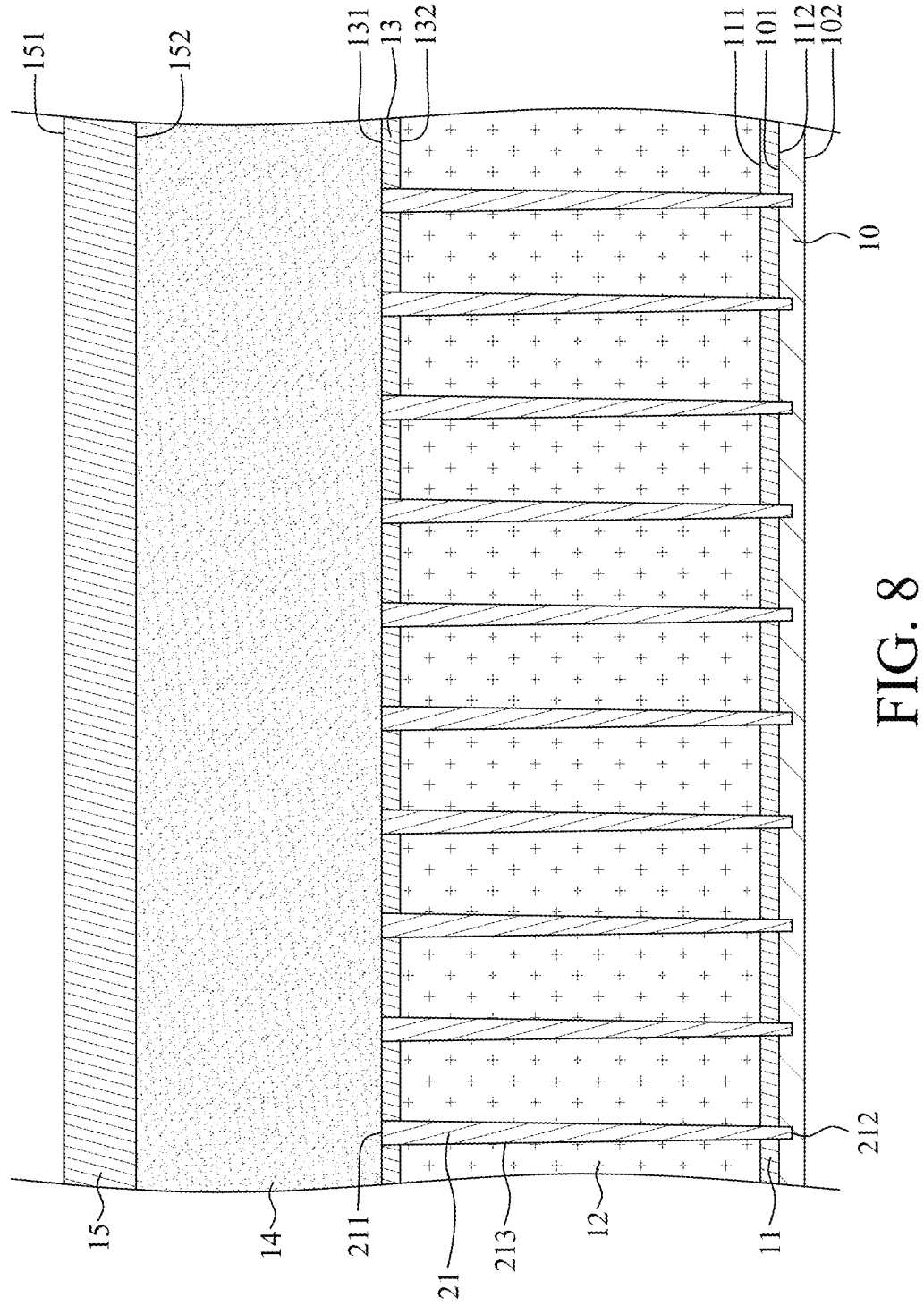
FIG. 8 illustrates one or more stages of a method of manufacturing a capacitor structure in accordance with some embodiments of the present disclosure.

Referring to FIG. 8, an upper material layer 14 is formed or disposed on the top surface 131 of the second support layer 13. The upper material layer 14 may be include a dielectric material or an insulation material, such as nitride, oxide, oxynitride amorphous silicon, polycrystalline silicon, or other suitable another. For example, the upper material layer 14 may include, but are not limited to, hafnium silicate (HfSiO$_x$), hafnium oxide (HfO$_2$), zirconium silicate (ZrSiO$_x$), zirconium oxide (ZrO$_2$), silicon nitride (Si$_3$N$_4$), silicon oxynitride (SiON), or silicon oxide (SiO$_2$), tetraethylorthosilicate (TEOS), carbon-doped silicon, etc. The upper material layer 14 may be formed by deposition. The material of the upper material layer 14 may be same as or different from the material of the lower material layer 12. The lower material layer 12 and the upper material layer 14 may have different etching rates with respect to an etchant. In some embodiments, the lower material layer 12 may have a faster etching rate than the upper material layer 14. Further, a thickness of the upper material layer 14 may be equal to or different from a thickness of the lower material layer 12.

Then, a third support layer 15 may be formed or disposed on the upper material layer 14. The third support layer 15 of FIG. 8 may be similar to or same as the third support layer 15 of FIG. 1, and may have a top surface 151 and a bottom surface 152 opposite to the top surface 151. The third support layer 15 may be formed by deposition.

Figure 9:
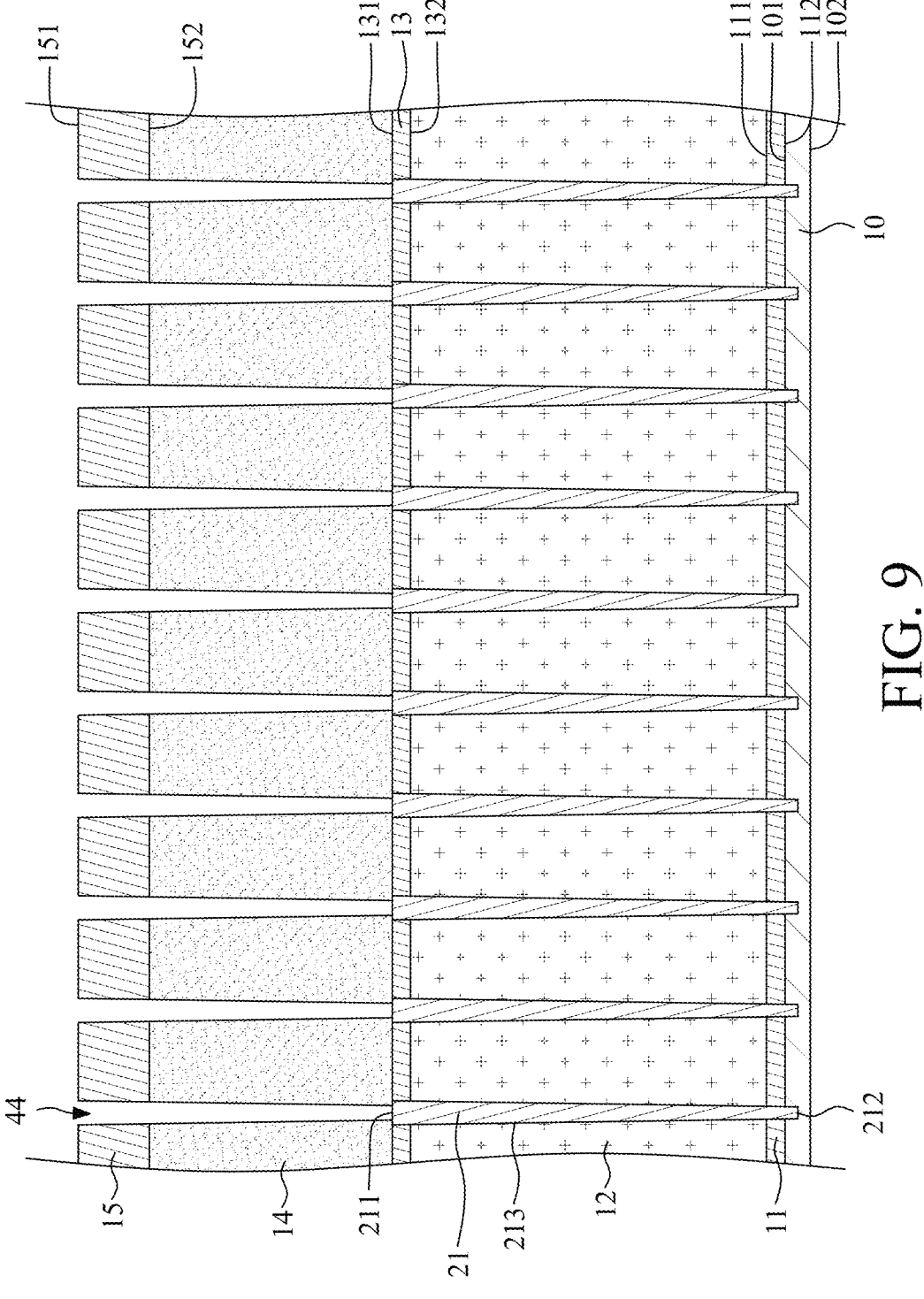
FIG. 9 illustrates one or more stages of a method of manufacturing a capacitor structure in accordance with some embodiments of the present disclosure.

Referring to FIG. 9, a plurality of second blind holes 44 may be formed to extend through the third support layer 15 and the upper material layer 14 to expose the top surface 211 of the first conductive via 21. That is, the second blind holes 40 may be stopped by the first conductive vias 21. In some embodiments, the second blind holes 44 may be formed by photography and etching process from the top surface 151 of the third support layer 15. Thus, the third support layer 15 and the upper material layer 14 are patterned to form the second blind holes 44 to expose a part of each the first conductive vias 21. The second blind holes 44 may taper toward the first conductive vias 21. As shown in FIG. 9, the second blind hole 44 may be aligned with the first conductive via 21.

Figure 10A:
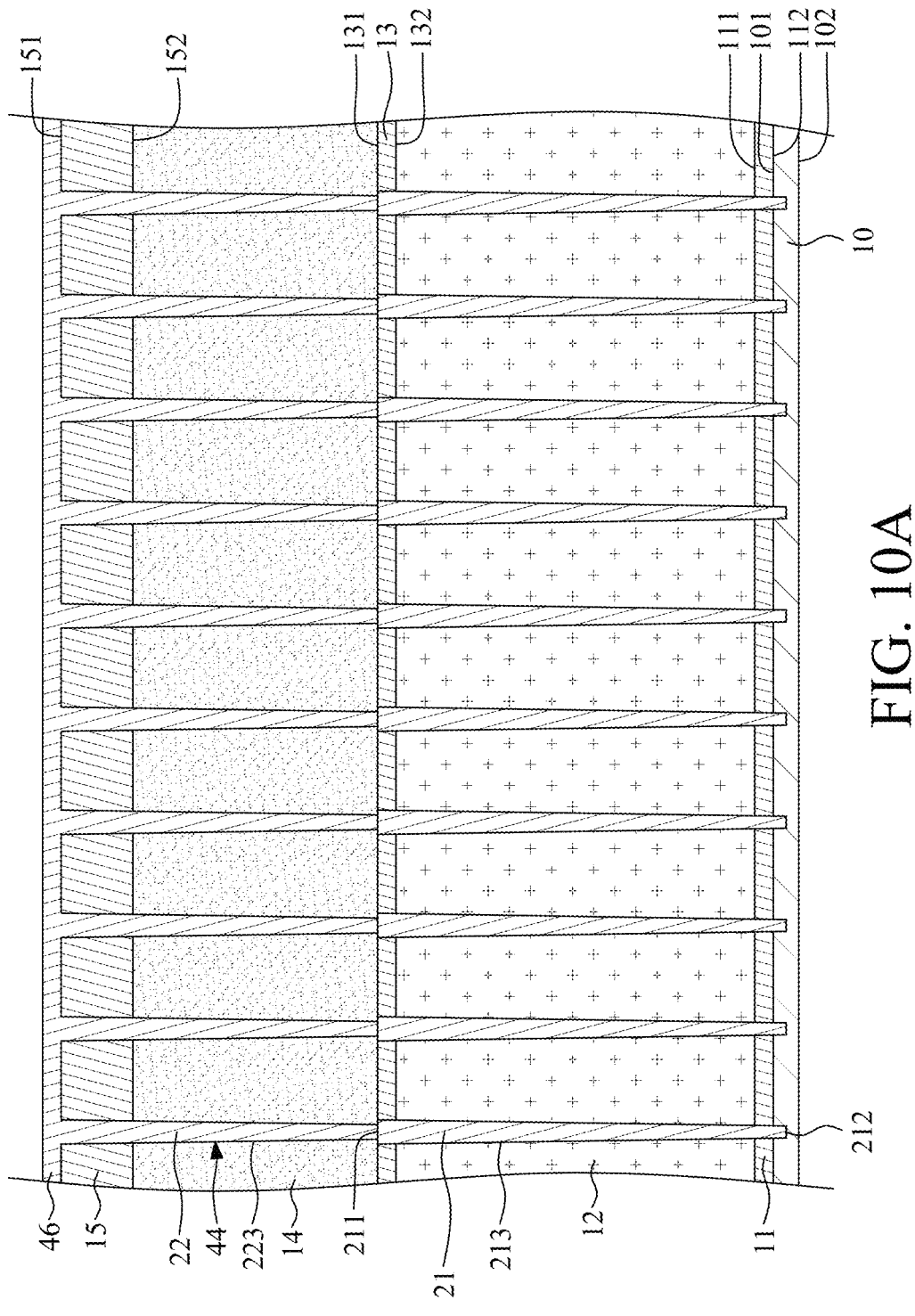
FIG. 10A illustrates one or more stages of a method of manufacturing a capacitor structure in accordance with some embodiments of the present disclosure.
Figure 10B:
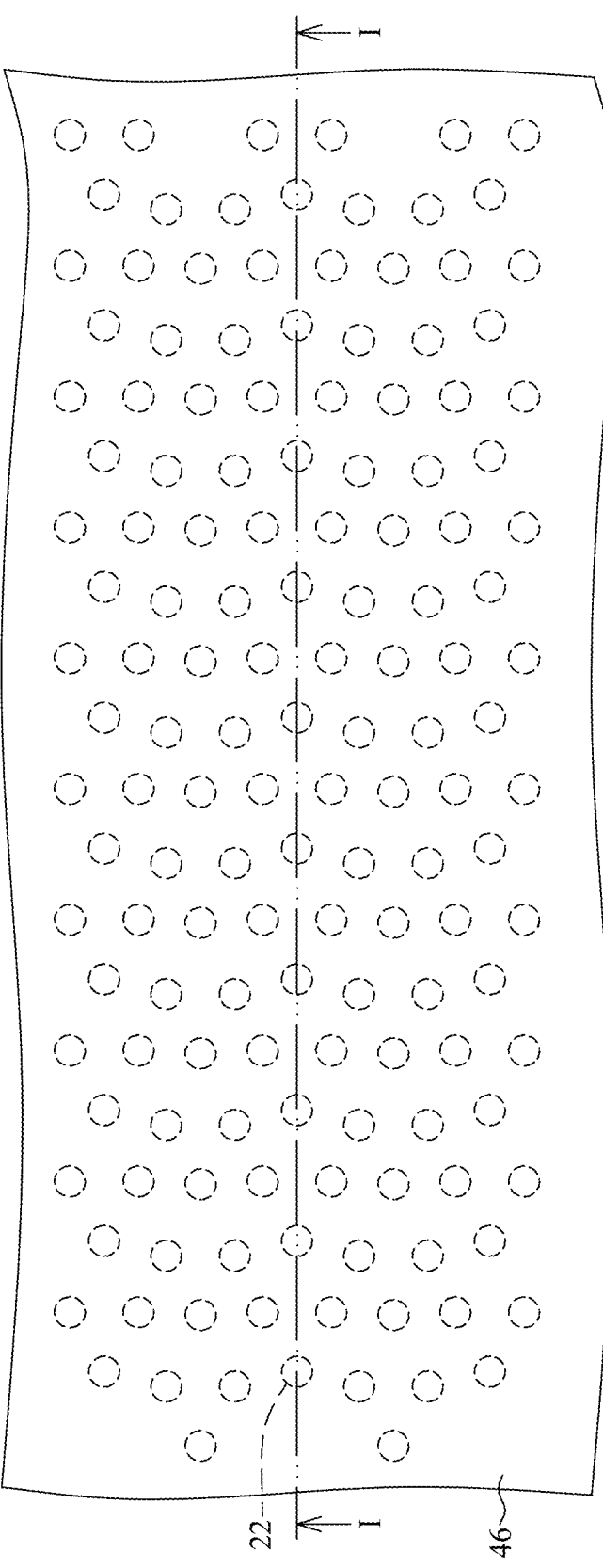
FIG. 10B illustrates a top view of FIG. 10A.

Referring to FIG. 10A and FIG. 10B, a conductive material 46 is formed or disposed on the top surface 151 of the third support layer 15. FIG. 10B may illustrate a top view of FIG. 10A. Alternatively, FIG. 10A may illustrate a cross-sectional view of FIG. 10B taken along line I-I. As shown in FIG. 10A, a portion of the conductive material 46 may be disposed in the second blind holes 40 to fill up the second blind holes 40 to form a plurality of second conductive vias 22. The conductive material 46 may be formed by deposition. As shown in FIG. 10B, the second conductive vias 22 may be arranged in an array or a substantial array. The second conductive vias 22 are physically connected and electrically connected to the first conductive vias 21.

Figure 11A:
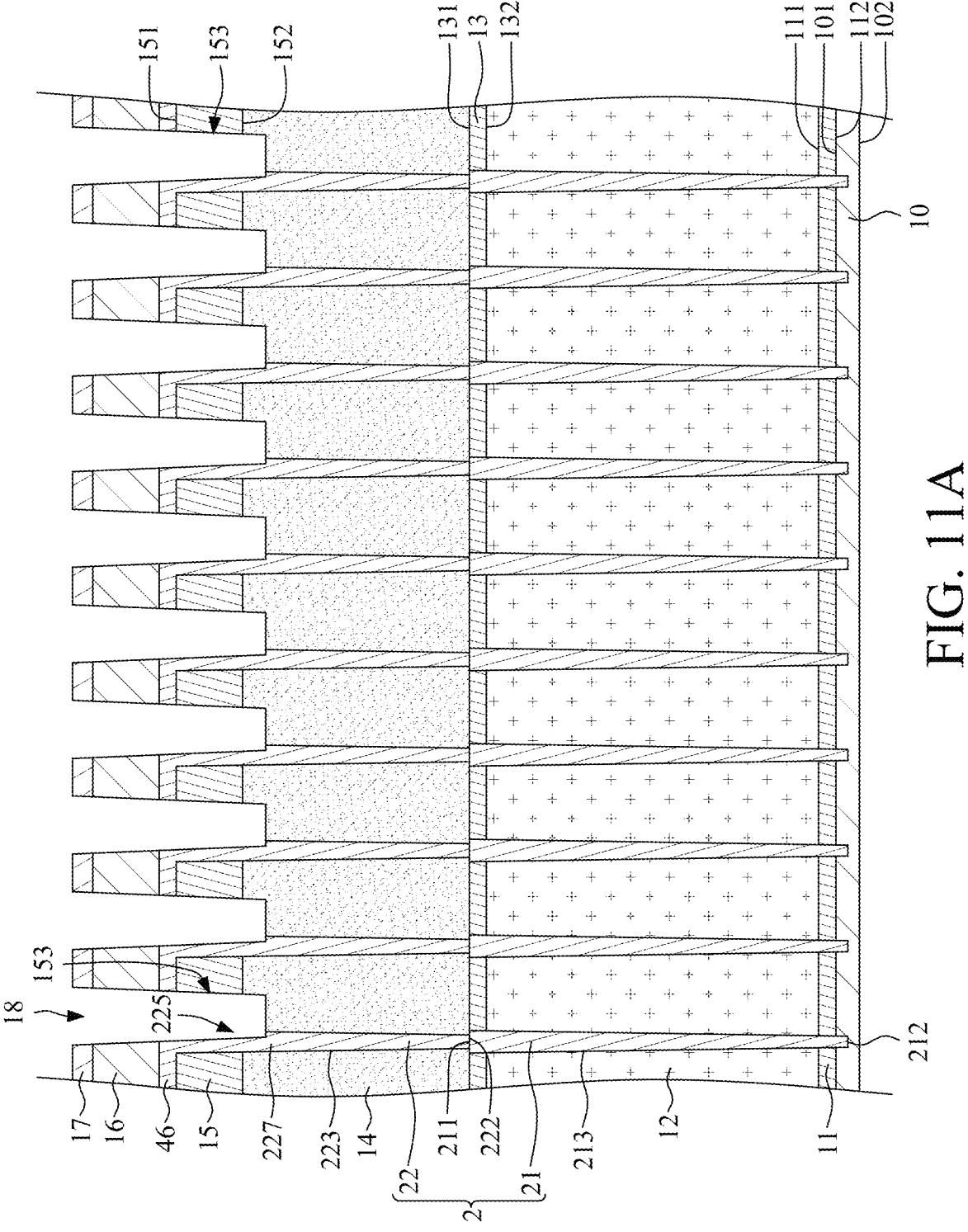
FIG. 11A is a schematic cross-sectional view of a capacitor structure in accordance with some embodiments of the present disclosure.
Figure 11B:
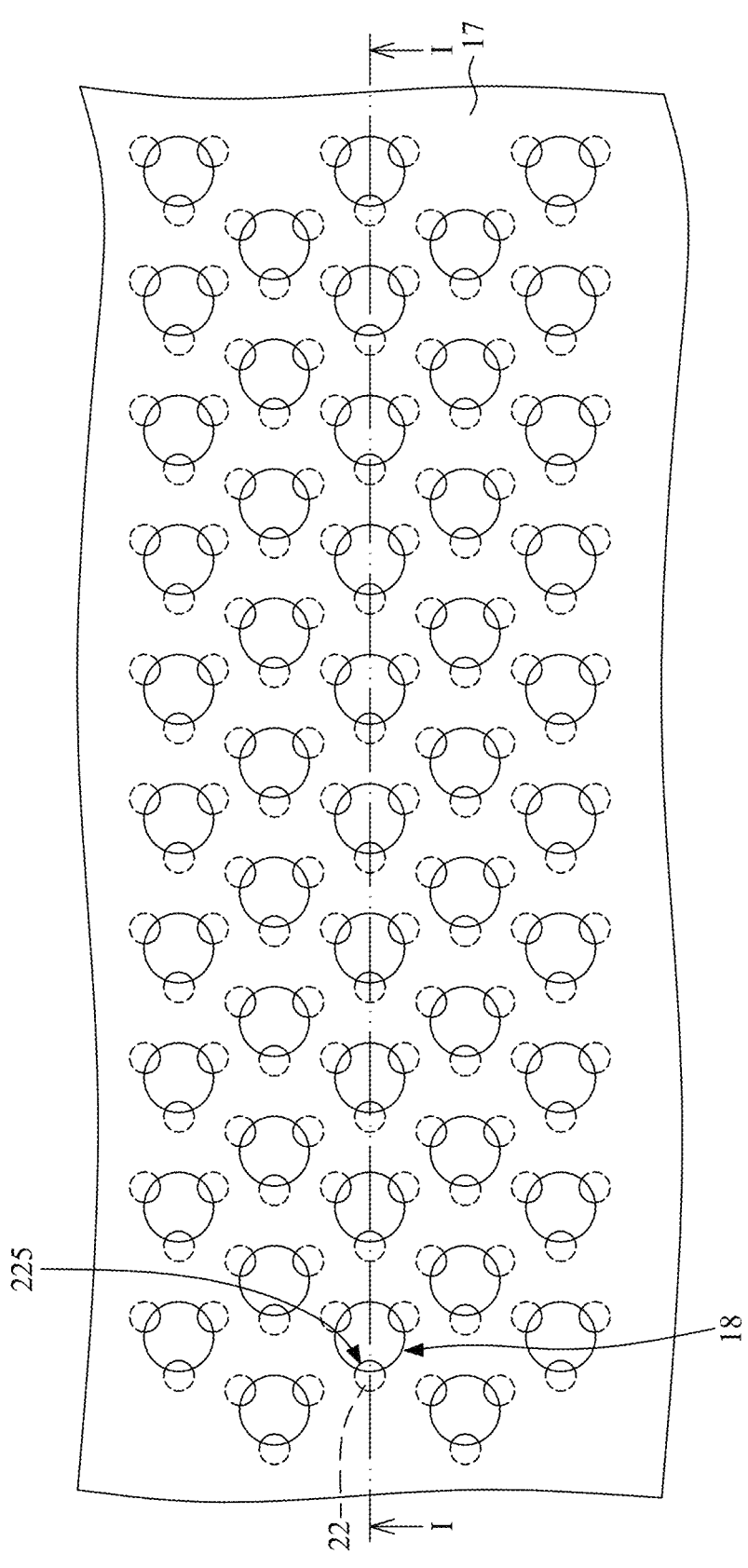
FIG. 11B illustrates a top view of FIG. 11A.

Referring to FIG. 11A and FIG. 11B, a first mask layer 16 and a second mask layer 17 are formed or disposed on the conductive material 46 on the top surface 151 of the third support layer 15. Then, a plurality of third blind holes 18 are formed on the top surface of the second mask layer 17. FIG. 11B may illustrate a top view of FIG. 11A. Alternatively, FIG. 11A may illustrate a cross-sectional view of FIG. 11B taken along line I-I.

The first mask layer 16 may be formed or disposed on the top surface 151 of the third support layer 15. The first mask layer 16 may include, for example, nitride, oxide, oxynitride amorphous silicon, polycrystalline silicon, or another material suitable for use in the required patterning operation. For example, the first mask layer 16 may include SiN harkmask. In some embodiments, the first mask layer 16 may be formed through, for example, a CVD operation, an LPCVD operation, a PECVD operation, other feasible operations, or a combination thereof.

The second mask layer 17 may be formed or disposed on the first mask layer 16. The second mask layer 17 may include, for example, nitride, oxide, oxynitride amorphous silicon, polycrystalline silicon, or another material suitable for use in the required patterning operation. For example, the second mask layer 17 may include oxide harkmask. In some embodiments, the second mask layer 17 may be formed through, for example, a CVD operation, an LPCVD operation, a PECVD operation, other feasible operations, or a combination thereof.

Then, the third blind holes 18 may be formed to extend through the second mask layer 17, the first mask layer 16, the conductive material 46 on the top surface 151 of the third support layer 15 and the third support layer 15 to expose a portion of the upper portion 227 of the second conductive via 22 and a part of the upper material layer 14. The third blind holes 18 may extend into the upper material layer 14 but may not extend through the upper material layer 14. That is, the third blind holes 18 may be stopped by the upper material layer 14. In some embodiments, the third blind holes 18 may be formed by photography and etching process from the top surface of the second mask layer 17. For example, the third blind holes 18 may be formed by dry etching. Thus, the second mask layer 17, the first mask layer 16, the conductive material 46 on the top surface 151 of the third support layer 15 and the third support layer 15 are patterned to form the third blind holes 18 to expose a part of each the second conductive vias 22 and a part of the upper material layer 14. The third blind holes 18 may taper downward.

As shown in FIG. 11A and FIG. 11B, the third blind holes 18 may not be at a middle position between two second conductive vias 22. Thus, a portion of the upper portion 227 of each of the second conductive vias 22 may be removed during the formation of the third blind holes 18. As a result, an indentation portion 225 may be formed at the upper portion 227 of the second conductive via 22. In addition, the third support layer 15 may define a plurality of openings 153 extending through the third support layer 15 during the formation of the third blind holes 18. A sidewall of the indentation portion 225 of the second conductive via 22 may be substantially aligned with or substantially coplanar with a sidewall of the opening 153 of the third support layer 15 since they are formed concurrently at a same manufacturing stage. That is, the sidewall of the indentation portion 225 of the second conductive via 22 and the sidewall of the opening 153 of the third support layer 15 may be portions of the third blind hole 18.

As shown in FIG. 11B, the third blind hole 18 may overlap three second conductive vias 22 from a top view. It is contemplated that the number of the second conductive vias 22 that are overlapped by one third blind hole 18 is not limited. There may be two, four, five, or more second conductive vias 22 overlapped by one third blind hole 18. Further, a bottom surface of the indentation portion 225 may be exposed in the third blind hole 18 from the top view.

Figure 12:
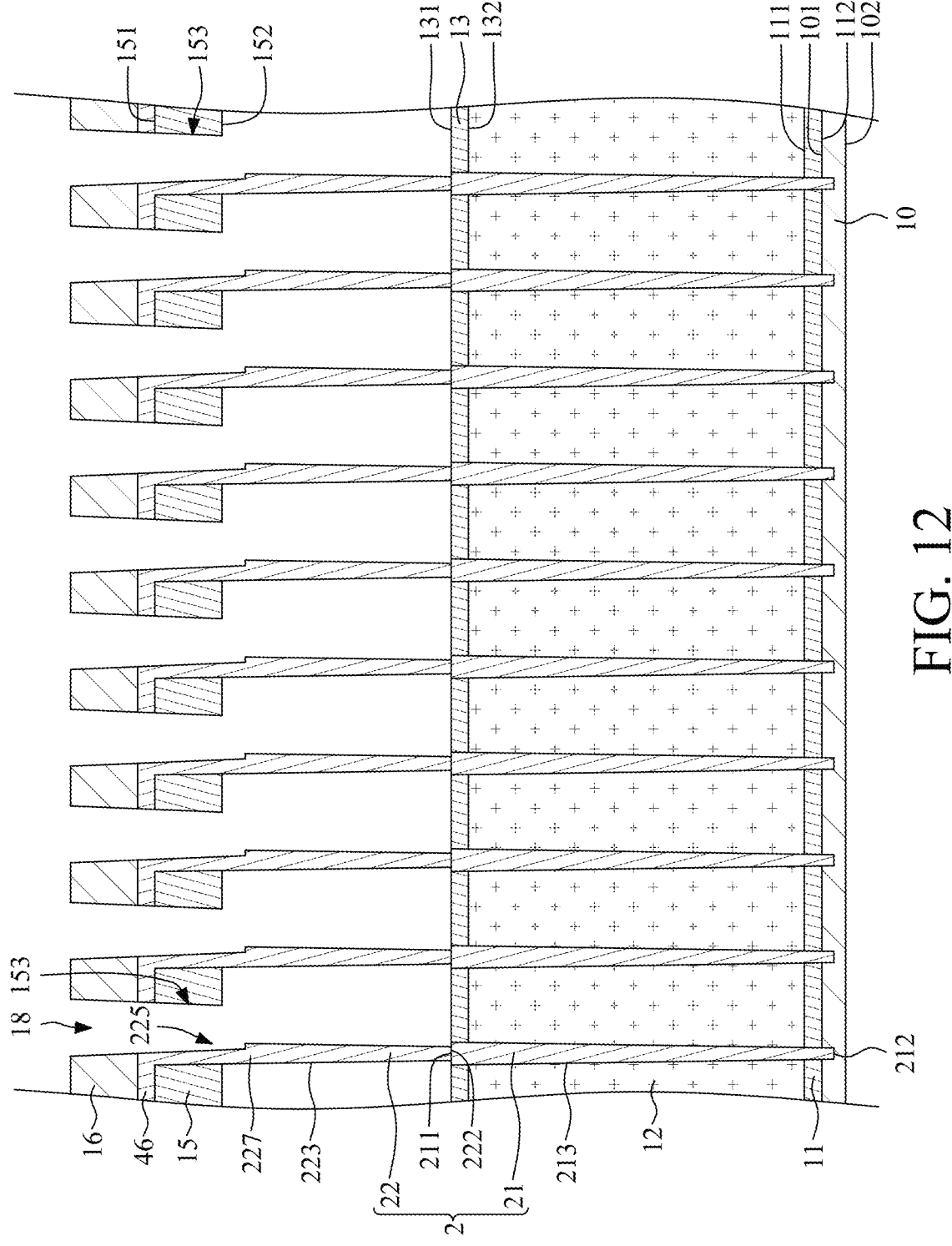
FIG. 12 illustrates one or more stages of a method of manufacturing a capacitor structure in accordance with some embodiments of the present disclosure.

Referring to FIG. 12, the second mask layer 17 is removed. Then, the upper material layer 14 is removed by applying an etchant through the third blind hole 18. For example, the upper material layer 14 may be removed by wet etching. Meanwhile, the third support layer 15 is spaced apart from the second support layer 13.

Figure 13A:
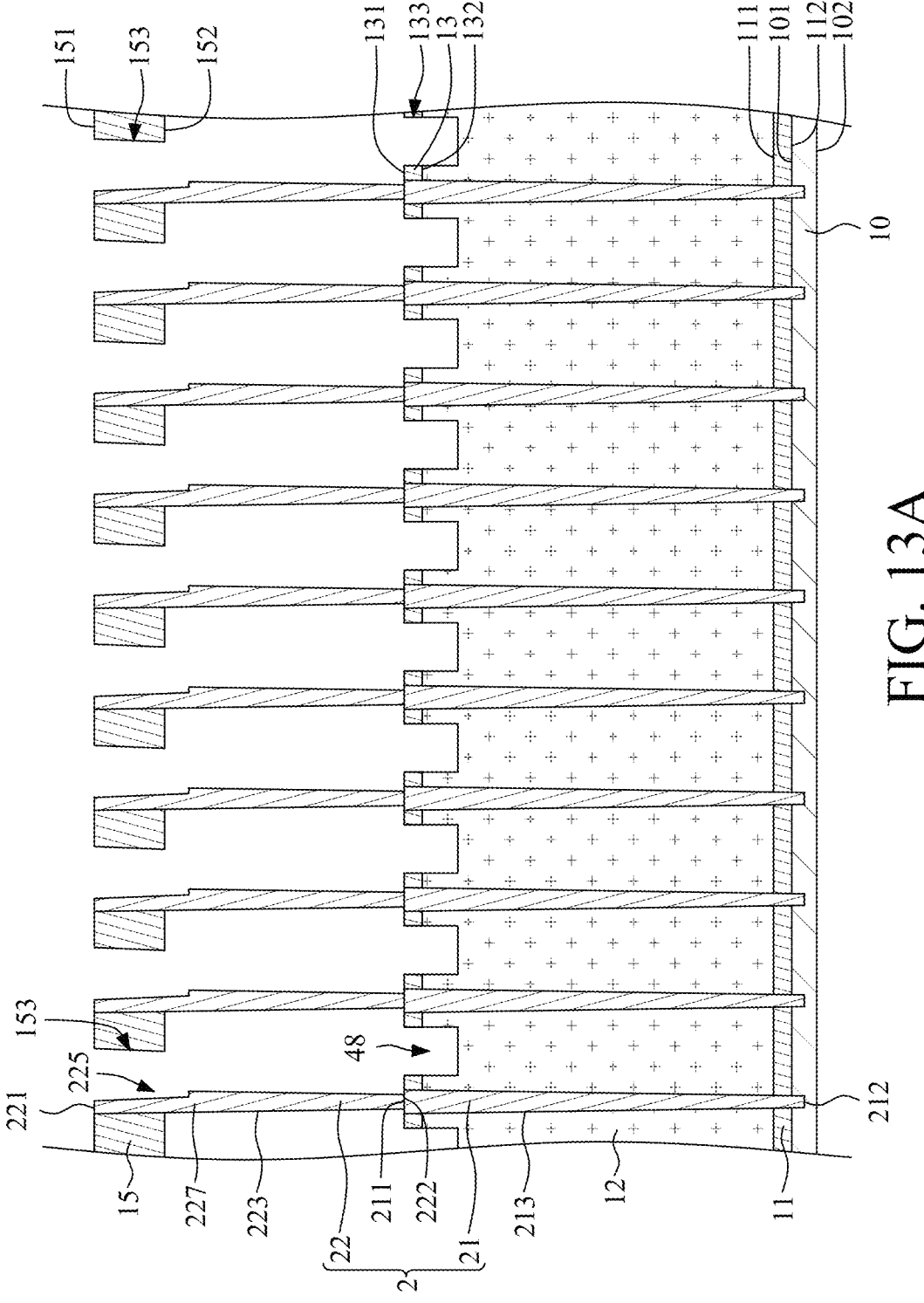
FIG. 13A illustrates one or more stages of a method of manufacturing a capacitor structure in accordance with some embodiments of the present disclosure.

Referring to FIG. 13A, the first mask layer 16 and the portion of the conductive material 46 on the top surface 151 of the third support layer 15 are removed by, for example, grinding. Thus, the second conductive vias 22 are exposed. The second conductive via 22 of FIG. 13A may be similar to or same as the second conductive via 22 of FIG. 1, and may have a top surface 221, a bottom surface 222 opposite to the top surface 221, and a lateral surface 223 extending between the top surface 221 and the bottom surface 222. The second conductive via 22 may taper downward.

The bottom surface 222 of the second conductive via 22 may contact the top surface 211 of the first conductive via 21 Thus, the second conductive via 22 may stand on the first conductive via 21, and may be electrically connected to the first conductive via 21. A width of the bottom surface 222 of the second conductive via 22 may be less than a width of the top surface 211 of the first conductive via 21. In addition, the upper portion 227 of the second conductive via 22 may extend through the third support layer 15. The top surface 221 of the second conductive via 22 may be exposed from the third support layer 15. The top surface 221 of the second conductive via 22 may be substantially aligned with or substantially coplanar with the top surface 151 of the third support layer 15.

As shown in FIG. 13A, the lateral surface 213 of the first conductive via 21 is discontinuous with the lateral surface 223 of the second conductive via 22. Alternatively, the lateral surface 213 of the first conductive via 21 is non-coplanar with the lateral surface 223 of the second conductive via 22. Thus, in a cross-sectional view, one side of the lateral surface 213 of the first conductive via 21 is misaligned with one side of the lateral surface 223 of the second conductive via 22. On side of the entire lateral surface of the entire conductive via 2 is not a substantially straight line from a cross-sectional view. In some embodiments, the side of the lateral surface 213 of the first conductive via 21 is connected to the side of the lateral surface 223 of the second conductive via 22 through the top surface 211 of the first conductive via 21.

Figure 13B:
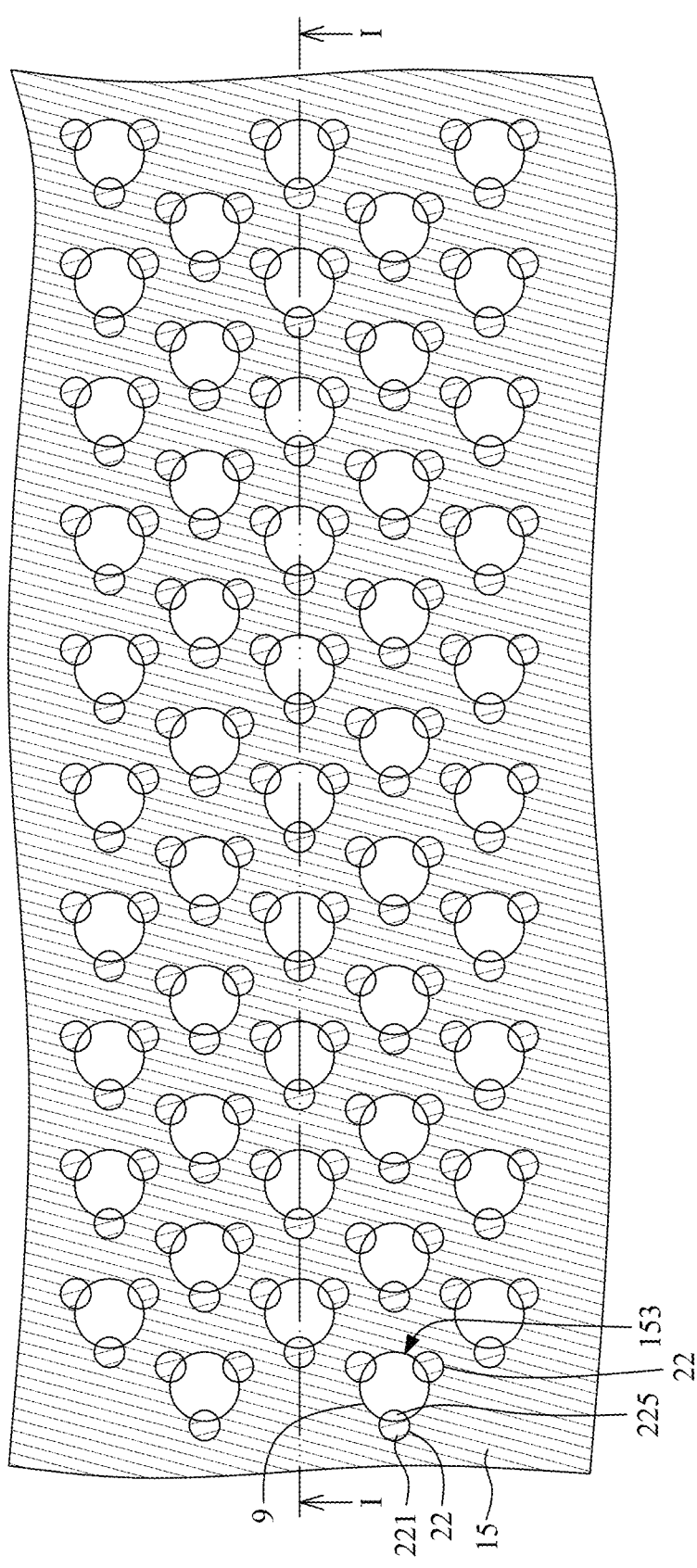
FIG. 13B illustrates a top view of FIG. 13A.

FIG. 13B may illustrate a top view of FIG. 13A. Alternatively, FIG. 13A may illustrate a cross-sectional view of FIG. 13B taken along line I-I. As shown in FIG. 13B, three sidewalls of three indentation portions 225 of three second conductive vias 22 and a sidewall of the opening 153 of the third support layer 15 may jointly define a complete circle 9 from a top view. It is contemplated that the number of the second conductive vias 22 that jointly define a complete circle 9 with the sidewall of the opening 153 of the third support layer 15 is not limited. There may be a plurality of sidewalls of a plurality of indentation portions 225 of two, four, five, or more second conductive vias 22 and a sidewall of the opening 153 of the third support layer 15 that jointly define a complete circle 9 from a top view.

Then, a plurality of fourth blind holes 48 may be formed to extend through the second support layer 13 to expose a part of the lower material layer 12. The fourth blind holes 48 may extend into the lower material layer 12 but may not extend through the lower material layer 12. That is, the fourth blind holes 48 may be stopped by the lower material layer 12. In some embodiments, the fourth blind holes 48 may be formed by etching process from the top surface 131 of the second support layer 13. For example, the fourth blind holes 48 may be formed by dry etching. Thus, the second support layer 13 is patterned to form the fourth blind holes 48 to expose a part of the lower material layer 12. The fourth blind holes 48 may be at a middle position between two first conductive vias 21. Thus, no portion of the upper portion of each of the first conductive vias 21 may be removed during the formation of the fourth blind holes 48. In addition, the second support layer 13 may define a plurality of openings 133 extending through the second support layer 13 during the formation of the fourth blind holes 48.

Figure 14:
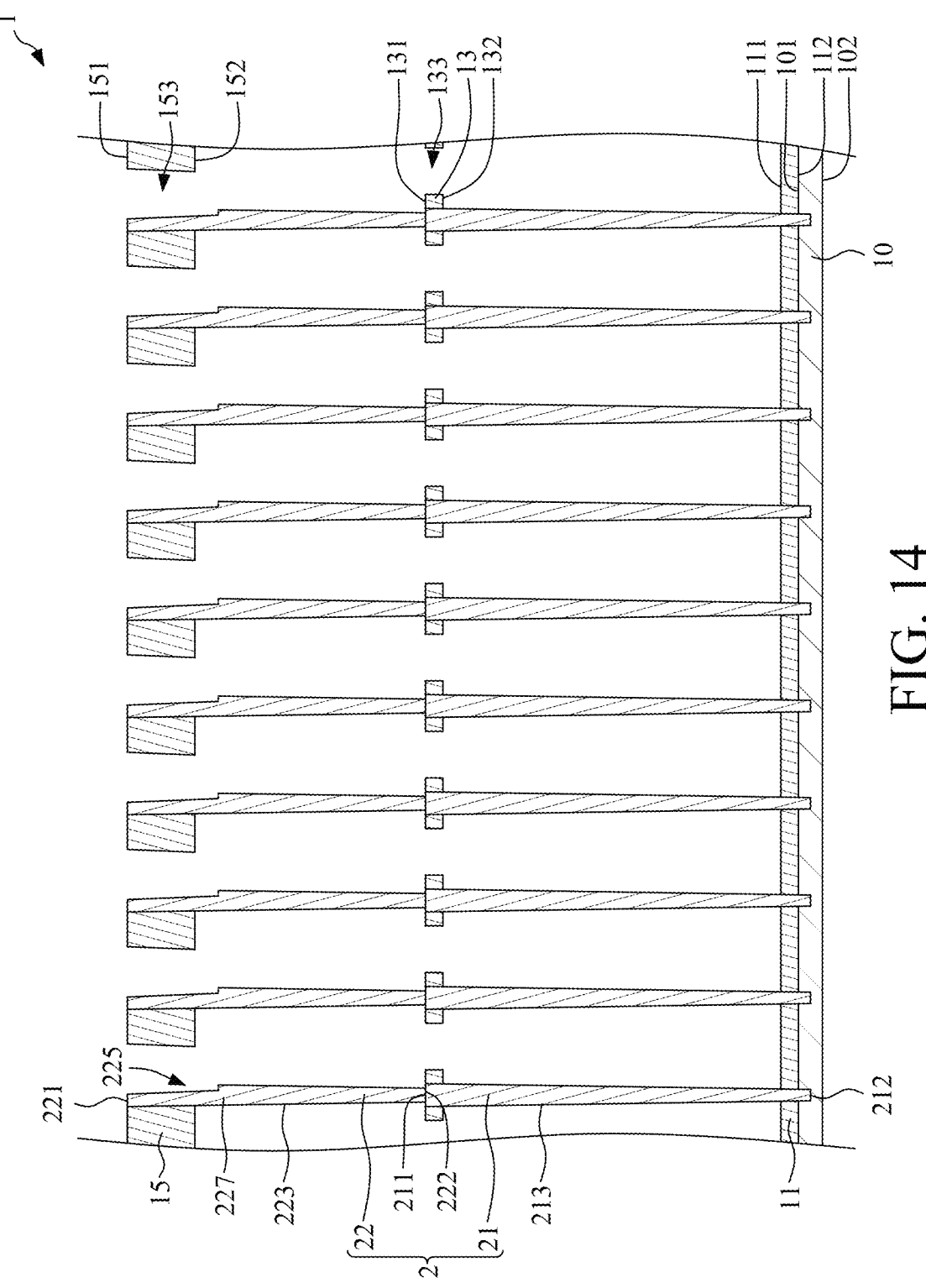
FIG. 14 illustrates one or more stages of a method of manufacturing a capacitor structure in accordance with some embodiments of the present disclosure.

Referring to FIG. 14, the lower material layer 12 is removed by applying an etchant through the fourth blind hole 48. For example, the lower material layer 12 may be removed by wet etching. Meanwhile, the first support layer 11 is spaced apart from the second support layer 13, and a conductive structure 1 is formed. The conductive structure 1 of FIG. 14 may be same as or similar to the conductive structure 1 of FIG. 2.

Figure 15:
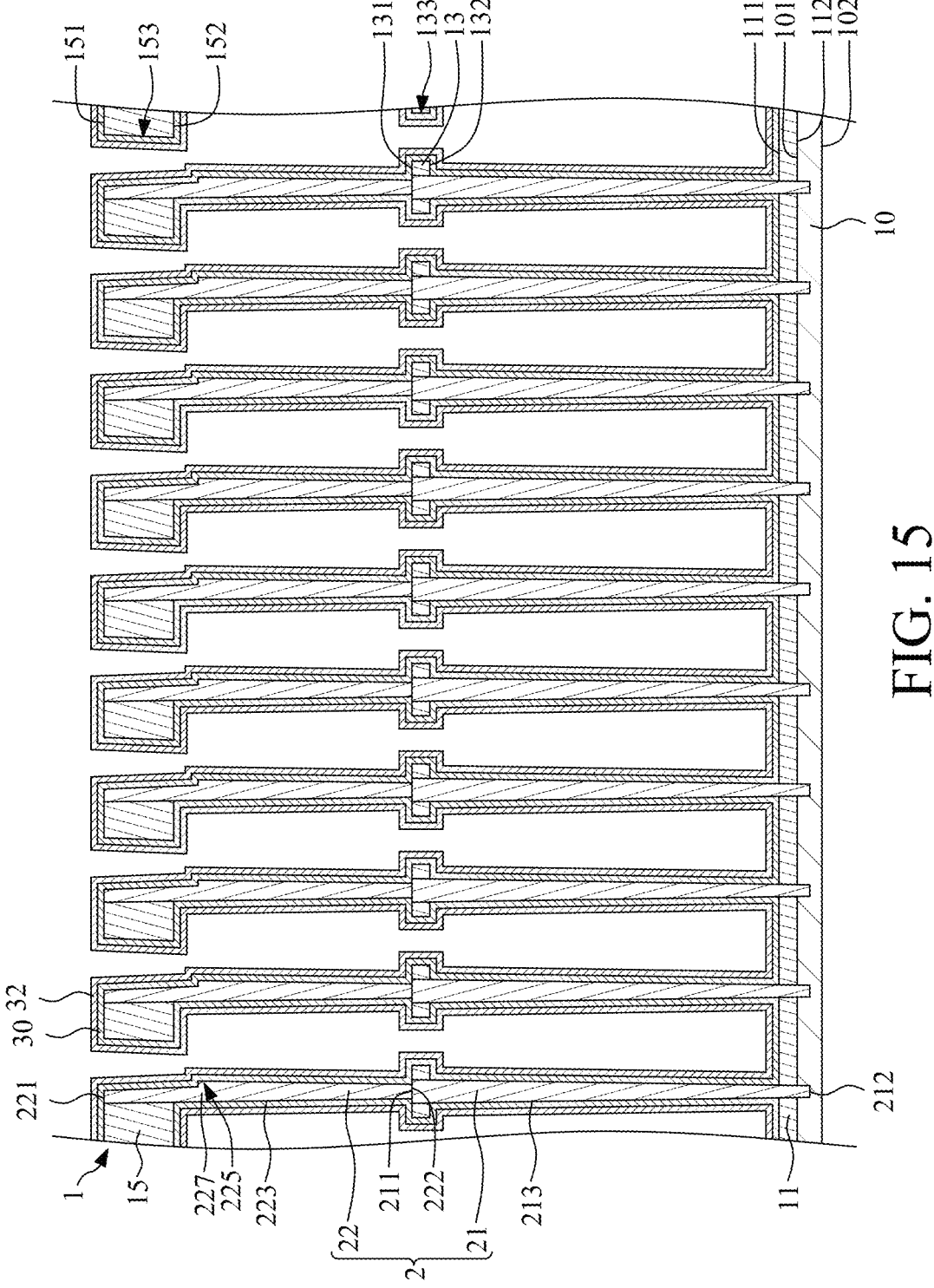
FIG. 15 illustrates one or more stages of a method of manufacturing a capacitor structure in accordance with some embodiments of the present disclosure.

Referring to FIG. 15, an intermediate dielectric layer 30 is formed or disposed on the conductive via 2 (including the first conductive via 21 and the second conductive vias 22). In some embodiments, the intermediate dielectric layer 30 may be conformal with the conductive via 2 of the conductive structure 1. The intermediate dielectric layer 30 may cover and contact the sidewalls of the openings 133 of the second support layer 13, the sidewalls of the openings 153 of the third support layer 15, and portions of the conductive via 2 exposed from the first support layer 11, the second support layer 13 and the third support layer 15. Thus, the intermediate dielectric layer 30 may cover and contact the lateral surface of the conductive via 2 except for portions embedded in the first support layer 11, the second support layer 13 and the third support layer 15. Thus, the intermediate dielectric layer 30 may further cover and contact the indentation portion 225 of the second conductive via 22.

Then, a top electrode 32 is formed or disposed on the intermediate dielectric layer 30. The top electrode 32 may be conformal with the intermediate dielectric layer 30.

Then, a filling material 34 may fill the recess or cavity defined by the top electrode 32 so as to form the capacitor structure 3 of FIG. 1.

FIG. 16 illustrates a flow chart of a method 60 of manufacturing a conductive structure in accordance with some embodiments of the present disclosure.

In some embodiments, the method 60 may include a step S61, providing a base material including a first support layer on a first conductive layer, a lower material layer on the first support layer, and a second support layer on the lower material layer. For example, as shown in FIG. 5, the base material 5 may include a first conductive layer 10, a first support layer 11, a lower material layer 12 and a second support layer 13. The first support layer 11 is formed or disposed on the first conductive layer 10.

In some embodiments, the method 60 may include a step S62, forming a first conductive via extending through the first support layer, the lower material layer and the second support layer, wherein the first conductive via is electrically connected to the first conductive layer. For example, as shown in FIG. 7, the first conductive via 21 extends through the first support layer 11, the lower material layer 12 and the second support layer 13. The first conductive via 21 is electrically connected to the first conductive layer 10.

In some embodiments, the method 60 may include a step S63, forming an upper material layer on the second support layer. For example, as shown in FIG. 8, the upper material layer 14 may be formed on the second support layer 13.

In some embodiments, the method 60 may include a step S64, forming a third support layer on the upper material layer. For example, as shown in FIG. 8, the third support layer 15 may be formed on the upper material layer 14.

In some embodiments, the method 60 may include a step S65, forming a second conductive via extending through the third support layer and the upper material layer, wherein the second conductive via is electrically connected to the first conductive via. For example, as shown in FIG. 10A, the second conductive via 22 may extend through the third support layer 15 and the upper material layer 14. The second conductive via 22 is electrically connected to the first conductive via 21.

One aspect of the present disclosure provides a conductive structure. The conductive structure includes a first support layer, a second support layer, a first conductive via, a third support layer and a second conductive via. The second support layer is disposed over the first support layer. The first conductive via is disposed between the first support layer and the second support layer. The third support layer is disposed over the second support layer. The second conductive via is disposed between the second support layer and the third support layer, and electrically connected to the first conductive via. A lateral surface of the first conductive via is discontinuous with a lateral surface of the second conductive via.

Another aspect of the present disclosure provides a capacitor structure. The capacitor structure includes a conductive via, an intermediate dielectric layer and a top electrode. The conductive via includes a neck portion located near a middle portion thereof. The intermediate dielectric layer is disposed on the conductive via. The top electrode is disposed on the intermediate dielectric layer.

Another aspect of the present disclosure provides a method of manufacturing a conductive structure. The method includes providing a base material including a first support layer on a first conductive layer, a lower material layer on the first support layer, and a second support layer on the lower material layer. The method also includes forming a first conductive via extending through the first support layer, the lower material layer and the second support layer, wherein the first conductive via is electrically connected to the first conductive layer. The method also includes forming an upper material layer on the second support layer. The method also includes forming a third support layer on the upper material layer. The method also includes forming a second conductive via extending through the third support layer and the upper material layer, wherein the second conductive via is electrically connected to the first conductive via.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A capacitor structure, comprising:
   a conductive via including a neck portion located near a middle portion thereof;
   an intermediate dielectric layer disposed on the conductive via;
   a top electrode disposed on the intermediate dielectric layer;
   a first support layer;
   a second support layer disposed over the first support layer and defining an opening; and
   a third support layer disposed over the second support layer and defining an opening;
   wherein the neck portion of the conductive via has a tapered shape that a width thereof is gradually reduced away from the intermediate dielectric layer;

wherein the first support layer, the second support layer, and the third support layer are spaced apart from each other, wherein the conductive via extends through the first support layer, the second support layer and the third support layer, wherein the intermediate dielectric layer covers a sidewall of the opening of the second support layer, a sidewall of the opening of the third support layer, and portions of the conductive via exposed from the first support layer, the second support layer and the third support layer.

2. The capacitor structure of claim 1, wherein the intermediate dielectric layer is conformal with the conductive via, and the top electrode is conformal with the intermediate dielectric layer.

3. The capacitor structure of claim 1, wherein the conductive via further includes a shoulder portion, and the neck portion connects to the shoulder portion to form a step structure, wherein the width of the neck portion is less than a width of the shoulder portion.

4. The capacitor structure of claim 1, further comprising a filling material and a first conductive layer attached to a bottom surface of the first support layer, wherein the conductive via is electrically connected to the first conductive layer, wherein the filling material is filled between a bottom surface of the first support layer and a top surface of the second support layer and between a bottom surface of the second support layer and a top surface of the third support layer.

5. The capacitor structure of claim 1, wherein the conductive via comprises:

a first conductive via disposed between the first support layer and the second support layer; and a second conductive via disposed between the second support layer and the third support layer, and stacked on the first conductive via, wherein an interface between the first conductive via and the second conductive via is substantially coplanar with a top surface of the second support layer;

wherein the first conductive via and the second conductive via are tapered toward the first support layer.

6. The capacitor structure of claim 5, wherein a top surface of the first conductive via includes the shoulder portion, and a lower portion of the second conductive via includes the neck portion.

7. The capacitor structure of claim 5, wherein a lateral surface of the entire first conductive via has a substantially consistent slope, and a lateral surface of the entire second conductive via has a substantially consistent slope.

8. The capacitor structure of claim 7, wherein the slope of the lateral surface of the first conductive via is equal to or different from the slope of the lateral surface of the second conductive via.

9. The capacitor structure of claim 1, wherein the conductive via comprises:

a first conductive via; and a second conductive via stacked on the first conductive via, wherein an interface is between the first conductive via and the second conductive via;

wherein the first conductive via and the second conductive via are tapered.

10. The capacitor structure of claim 9, wherein a top surface of the first conductive via includes the shoulder portion, and a lower portion of the second conductive via includes the neck portion.

11. The capacitor structure of claim 9, wherein an upper portion of the second conductive via defines an indentation portion, wherein the indentation portion of the second conductive via is formed at one of lateral surfaces thereof.

12. The capacitor structure of claim 11, wherein the intermediate dielectric layer covers the indentation portion of the second conductive via.

* * * * *